(12) United States Patent
Léonard et al.

(10) Patent No.: US 11,181,568 B2
(45) Date of Patent: Nov. 23, 2021

(54) DETECTION OF ANOMALIES IN AN ELECTRICAL NETWORK

(71) Applicant: HYDRO-QUÉBEC, Quebec (CA)

(72) Inventors: François Léonard, Quebec (CA); Arnaud Zinflou, Quebec (CA); Alexandre Bouffard, Quebec (CA); Mathieu Viau, Quebec (CA)

(73) Assignee: HYDRO-QUÉBEC, Quebec (CA)

( * ) Notice: Subject to any disclaimer, the term of this patent is extended or adjusted under 35 U.S.C. 154(b) by 549 days.

(21) Appl. No.: 16/316,052

(22) PCT Filed: Jul. 12, 2017

(86) PCT No.: PCT/CA2017/050847
§ 371 (c)(1),
(2) Date: Jan. 8, 2019

(87) PCT Pub. No.: WO2018/010028
PCT Pub. Date: Jan. 18, 2018

(65) Prior Publication Data
US 2021/0325441 A1    Oct. 21, 2021

(30) Foreign Application Priority Data
Jul. 14, 2016    (CA) .............................. CA 2936212

(51) Int. Cl.
*G01R 31/08* (2020.01)
*H02J 3/00* (2006.01)
*H02J 13/00* (2006.01)

(52) U.S. Cl.
CPC ......... *G01R 31/088* (2013.01); *G01R 31/086* (2013.01); *H02J 3/0012* (2020.01);
(Continued)

(58) Field of Classification Search
CPC ................. G01R 31/088; G01R 31/086; H02J 13/00002; H02J 13/00001; H02J 3/0012; H02J 13/00006; H02J 2203/20
See application file for complete search history.

(56) References Cited

U.S. PATENT DOCUMENTS 6,633,823 B2    10/2003    Bartone et al.
7,936,163 B2    5/2011    Lee
(Continued)

FOREIGN PATENT DOCUMENTS

EP        2869422         5/2015
WO    WO 2012/045498 A1    4/2012
(Continued)

OTHER PUBLICATIONS

Heman Shamachurn et al., "Electricity Theft Detection and Localisation in Unknown Radial Low Voltage Network", IJRET: International Journal of Research in Engineering and Technology, vol. 04 Issue: Jul. 7, 2015, pp. 72-77.
(Continued)

*Primary Examiner* — Mohammad K Islam
(74) *Attorney, Agent, or Firm* — Muirhead and Saturnelli, LLC

(57) ABSTRACT

The disclosed method detects anomalies in an electrical network. An ohmic matrix model of the network is initially generated from consumption measurements produced by meters connected to a same transformer. The model has currents carried by the meters as input, relative voltage drops of the meters referenced to a voltage of a reference node located on the network as output, and resistive quantities initially determined by currents and voltages based on the consumption measurements as matrix terms, the relative voltage being a voltage difference between a voltage determined for a meter and an average of voltages determined for a set of meters of the network. The model is iteratively (Continued)

modified according to detected anomalies, and a diagnosis of the network characterizing the detected anomalies is provided.

15 Claims, 8 Drawing Sheets

(52) U.S. Cl.
CPC .. *H02J 13/00001* (2020.01); *H02J 13/00002* (2020.01); *H02J 13/00006* (2020.01); *H02J 2203/20* (2020.01)

(56) References Cited

U.S. PATENT DOCUMENTS

| | | | |
|---|---|---|---|
| 7,986,246 B2 | 7/2011 | Angelis et al. | |
| 8,818,742 B2 | 8/2014 | Ansari | |
| 8,989,910 B1 | 3/2015 | Klots | |
| 9,013,173 B2 | 4/2015 | Veillette | |
| 9,094,430 B2 | 7/2015 | Wang | |
| 9,122,618 B2 | 9/2015 | Hughes | |
| 9,189,822 B2 | 11/2015 | Conant et al. | |
| 9,214,836 B2 | 12/2015 | Flammer | |
| 9,285,242 B2 | 3/2016 | Arya et al. | |
| 11,095,151 B2* | 8/2021 | Forbes, Jr. | H02J 13/00028 |
| 2009/0281679 A1 | 11/2009 | Taft et al. | |
| 2010/0007336 A1 | 1/2010 | De Buda | |
| 2010/0102826 A1* | 4/2010 | Edwards | G01R 31/42 324/543 |
| 2013/0076534 A1 | 3/2013 | Conant et al. | |
| 2013/0191051 A1 | 7/2013 | Stocker et al. | |
| 2014/0236506 A1 | 8/2014 | Nikovski et al. | |
| 2014/0317258 A1 | 10/2014 | Riley | |
| 2014/0368189 A1 | 12/2014 | Bernheim et al. | |
| 2015/0149128 A1 | 5/2015 | Baone et al. | |
| 2015/0153153 A1 | 6/2015 | Premm et al. | |
| 2015/0241488 A1 | 8/2015 | Sonderegger | |
| 2015/0278410 A1 | 10/2015 | Kumar et al. | |
| 2016/0035049 A1 | 2/2016 | Ramesh et al. | |
| 2016/0054364 A1 | 2/2016 | Chen et al. | |
| 2016/0117326 A1 | 4/2016 | Steigler | |
| 2016/0124036 A1* | 5/2016 | Chen | G01R 31/1272 324/551 |
| 2016/0320431 A1 | 11/2016 | Driscoll et al. | |
| 2019/0011283 A1* | 1/2019 | Soutar | G01D 4/004 |

FOREIGN PATENT DOCUMENTS

| | | |
|---|---|---|
| WO | WO2012045498 | 4/2012 |
| WO | WO2013086631 | 6/2013 |
| WO | WO2014130366 | 8/2014 |
| WO | WO2014185921 | 11/2014 |
| WO | WO2015120141 | 8/2015 |
| WO | WO 2015/130819 A1 | 9/2015 |
| WO | WO2015130819 | 9/2015 |
| WO | WO2016049369 | 3/2016 |

OTHER PUBLICATIONS

C. J. Bandim et al., "Identification of Energy Theft and Tampered Meters Using a Central Observer Meter: A Mathematical Approach", IEEE 2003, PES Transmission and Distribution Conference and Exposition, pp. 163-168.

Stephen McLaughlin et al., "A Multi-Sensor Energy Theft Detection Framework for Advanced Metering Infrastructures", IEEE Journal on Selected Areas in Communications, vol. 31, No. 7, Jul. 2013, pp. 1319-1330.

Sanujit Sahoo et al., "Electricity Theft Detection Using Smart Meter Data", IEEE 2015, Power & Energy Society Innovative Smart Grid Technologies Conference (ISGT).

* cited by examiner

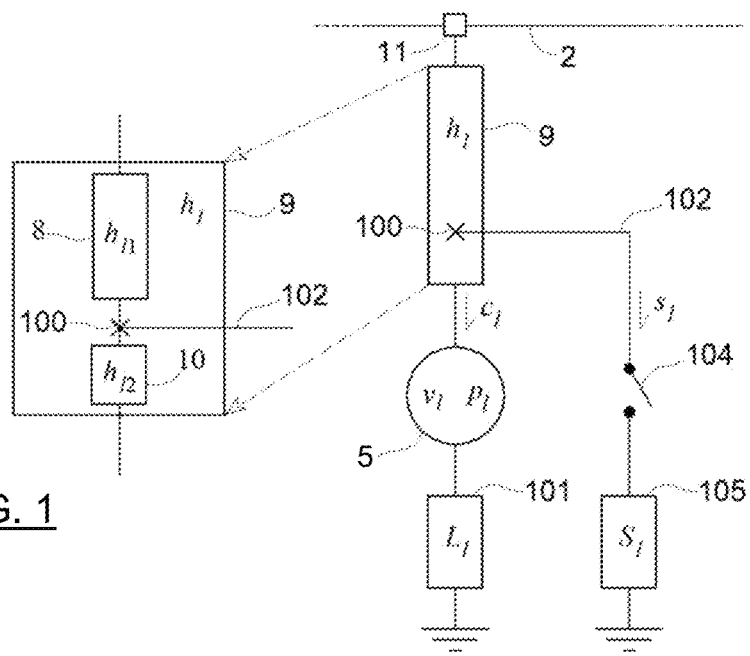
FIG. 1
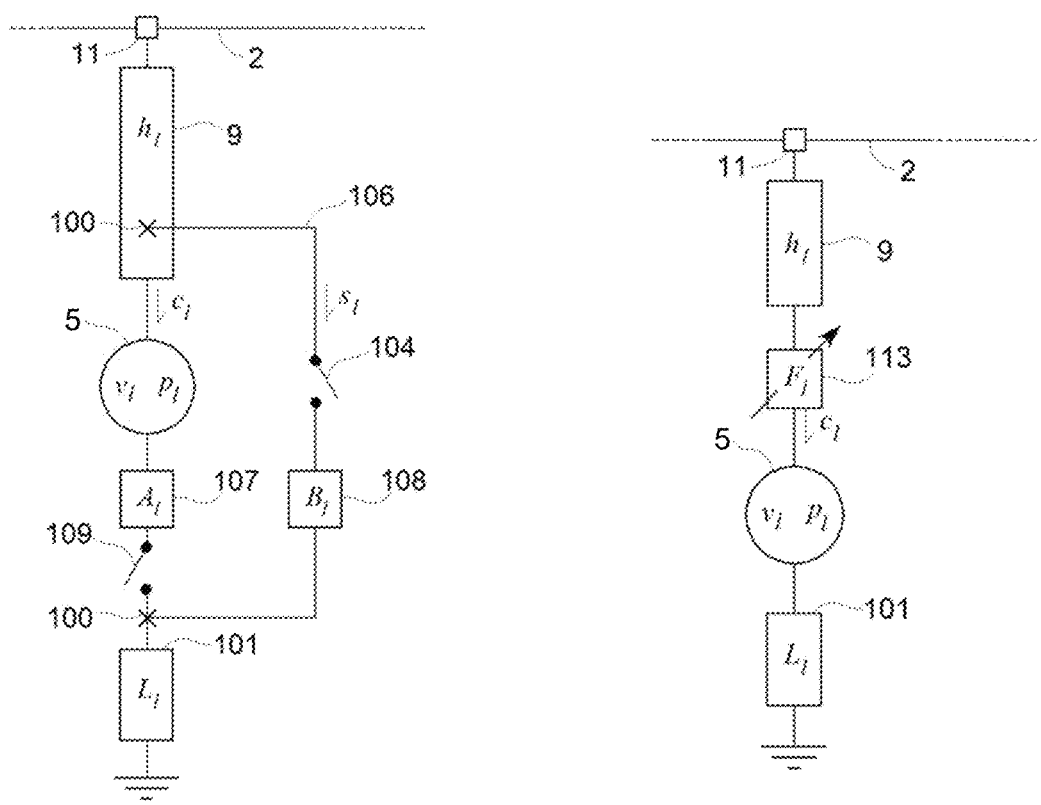
FIG. 2
FIG. 3

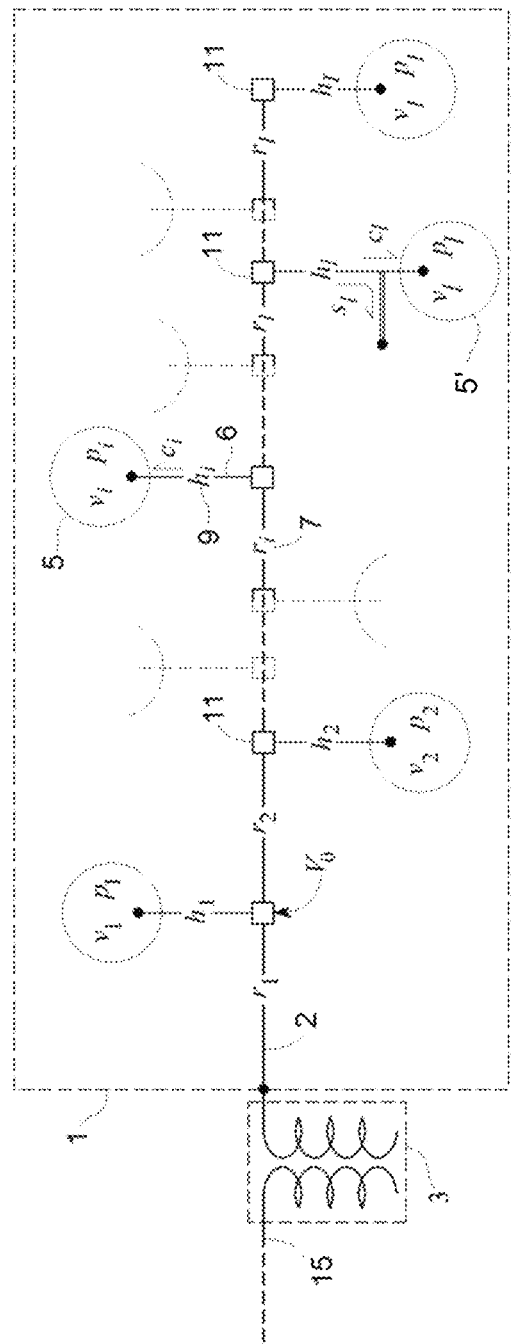
FIG. 4
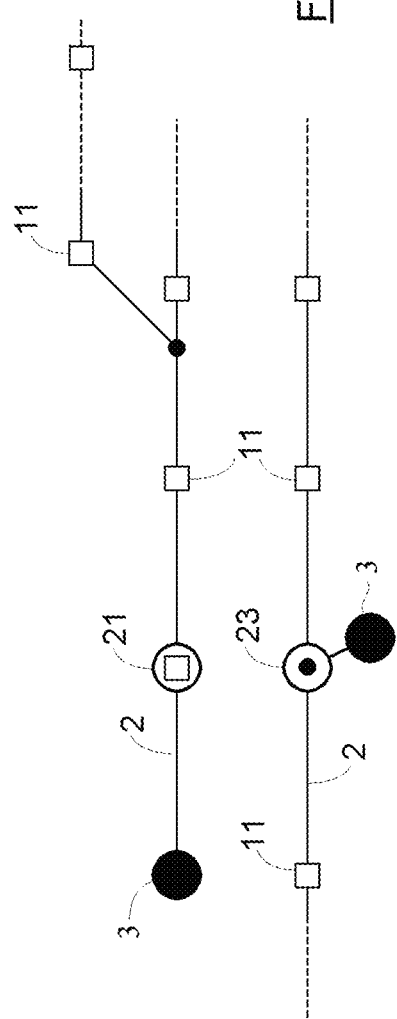
FIG. 5A
FIG. 5B

DETECTION OF ANOMALIES IN AN ELECTRICAL NETWORK

FIELD OF THE INVENTION

The invention generally relates to a method that processes consumption measurements provided by smart meters presumed to be connected to a same low-voltage network, and in particular to a method for detecting anomalies in an electrical network, a system and a non-transitory tangible computer program product implementing the method. The method allows in particular detecting and quantifying electrical non-compliances (ENCs) that may be present.

BACKGROUND

The data transmitted by smart meters contain information that may be useful to perform a detection of ENCs. Not only the measurements taken by the smart meters are precise, synchronized and abounding, they comprise measurements covering two aspects for analyzing a model, namely the input, a current output by a meter, and the output, a voltage measured at the meter. For I meters connected to a same transformer, there is obtained I inputs and I outputs, which gives a determined system of equations, provided that the line supply voltage feeding the low-voltage transformer is known or at least constant. But in reality, the line voltage is unknown, varies considerably and quickly. Furthermore, there may be electromechanical meters that, connected to the transformer, cause the system of equations to be underdetermined for characterizing the transformer network. Finally, ENCs also add unknowns to the system of equations. This is why until now, the proposed methods and systems cannot allege generating a low-voltage network model precise enough to detect and quantify the ENCs. The following patents and patent applications provide examples of methods and systems proposed so far for detecting ENCs: US20100007336 (de Buda), US20140236506 (Nikovski et al.), US20140368189 (Bernheim et al.), US20150241488 (Sonderegger), US20160035049 (Vinodini et al.), US20160054364 (Chen et al.), US20160117326 (Steigler), US2016320431 (Driscoll et al.), U.S. Pat. No. 6,633,823 (Bartone et al.), U.S. Pat. No. 7,936,163 (Lee), U.S. Pat. No. 7,986,246 (Angelis et al.), U.S. Pat. No. 8,818,742 (Ansari), U.S. Pat. No. 9,013,173 (Veillette), U.S. Pat. No. 9,122,618 (Hugues), WO2013086631 (Hughes) and WO2016049369 (Siebel et al.). The following patents and patent applications provide examples of methods and systems proposed so far for topology analysis: EP2869422 (Maximini et al.), US20090281679 (Taft et al.), US20140317258 (Riley), US20150149128 (Baone et al.), US20150278410 (Kumar et al.), U.S. Pat. No. 9,094,430 (Wang), U.S. Pat. No. 9,189, 822 (Conant et al.), U.S. Pat. No. 9,214,836 (Flammer), U.S. Pat. No. 9,285,242 (Arya et al.), WO2014130366 (Hansell et al.), WO2014185921 (Marinakis), WO2015120141 (Shima) and WO2015130819 (Sonderreger).

SUMMARY

According to an embodiment of the invention, there is provided a computer implemented method for detecting anomalies in an electrical network, the method comprising the steps of:

(i) retrieving consumption measurements produced by meters presumed to be connected to a same transformer of the electrical network based on a preestablished topology of the electrical network, the consumption measurements being distributed through time;

(ii) generating an ohmic matrix model of the electrical network, the ohmic matrix model having currents carried by the meters as input, relative voltage drops of the meters referenced to a voltage of a reference node located on the electrical network as output, and resistive quantities initially determined by currents and voltages between a voltage determined for one of the meters and an average of voltages determined for a set of meters of the electrical network as matrix terms;

(iii) performing at least one of the following operations:
  comparing the resistive quantities of the ohmic matrix model with one another according to preestablished matrix comparison patterns and with respect to preestablished quantity thresholds indicative of anomalies;
  determining an instantaneous relative voltage drop of a meter based on the consumption measurements of the meter and determining deviations with respect to the instantaneous relative voltage drop estimated with the ohmic matrix model for the meter, the deviations exceeding a preset threshold being indicative of anomalies; and
  generating an inverse matrix model of the ohmic matrix model, the inverse matrix model having deviations of instantaneous relative voltage drops of the meters as input and unmetered currents as a function of the deviations as output, the unmetered currents exceeding a preset threshold being indicative of anomalies;

(iv) depending on whether a preestablished modeling condition of the ohmic matrix model is satisfied or not, returning to step (ii) while modifying the input and the resistive quantities as a function of the anomalies detected at step (iii); and (v) providing a diagnosis of the electrical network characterizing the anomalies detected at step (iii).

According to other embodiments of the invention, there is provided a system and a non-transitory tangible computer program product implementing the above recited method.

The following provides an outline of certain possibly preferable features of the invention which are to be considered non-restrictively and which will be more fully described hereinafter.

According to an embodiment of the present invention, the method may be summarized such that an electrical measurement is compared to a result predicted by a low-voltage network model comprising meters connected to the secondary of a same transformer for a detection of ENCs. Beforehand, the method described in the application WO2017/100916 (Leonard et al.) for updating a topology of the network by successive reallocation of the meters may be used to improve the veracity of the meter-transformer pairing links. For the modeling of the network, the problem of the line voltage variation is solved by comparing deviations of electrical voltage measurements of the meters with respect to an instantaneous average voltage obtained from all the meters or a subset of meters while referencing the voltage deviations with respect to a reference node that may be, for example, a first meter connection or a first line junction depending on the network topology. The model characterizing the low-voltage network is an ohmic matrix also called transfer function matrix allowing among other things diagnosing a presence of ENCs in the network. The method determines a relative ohmic matrix from the transfer function matrix. The terms of these matrices are in Ohm units and their quantities are determined by the electrical characteristics of the network. The relative ohmic matrix may be used to determine relative voltage drops between meters from the currents measured by the meters. These relative voltage drops, when they are compared to the voltage drops determined according to the meter measurements, give voltage difference deviations characterizing a type of ENC that may be present. For some types of ENCs, these deviations are also representative of currents unmetered by the meters. The inverse of the relative ohmic matrix, i.e. a pseudo-inverse or the inverse of its diagonal, multiplied by the voltage deviations between the voltage drops predicted by the model and the measured voltage drops, gives an estimate of the unmetered currents. A dispersion estimated for each term or element of the transfer function matrix gives a dispersion matrix. A display of the dispersion matrix allows detecting and characterizing ENCs by giving a reproducibility indication of a voltage response of the meters as a function of a load modulation of one of them. A correlation matrix and a coherence matrix may form other characterizing means of ENCs.

The method allows detecting ENCs such as meter-transformer pairing errors, a defective meter, a presence of electromechanical meters or flat-rate connections not entered in the database defining a topological description of the network, diversions, bypasses, defective connections or hot spots. The modeling of an ENC characterized by an unmetered current may be performed by adding an estimate of this current upstream of the calculation of the transfer function, thereby allowing confirming the modeling according to a voltage variation residue reduction between the voltage predicted by the model for a meter and the voltage measured by the meter.

BRIEF DESCRIPTION OF THE DRAWINGS

A detailed description of preferred embodiments of the invention will be given hereinbelow with reference to the following drawings:

FIG. 1 is a schematic diagram illustrating a diversion upstream of a meter.

FIG. 2 is a schematic diagram illustrating a bypass of a meter.

FIG. 3 is a schematic diagram illustrating a problem of overhead connection or of hot spot in the connection socket of a meter.

FIG. 4 is a single-wire schematic diagram of a low-voltage distribution network where a transformer is connected to clients, one of which exhibiting an anomaly.

FIGS. 5A and 5B are single-wire schematic diagrams illustrating two examples of low-voltage distribution line with connection to a transformer at line end and interposed between meters, respectively.

DETAILED DESCRIPTION OF THE PREFERRED EMBODIMENTS

Figure 6:
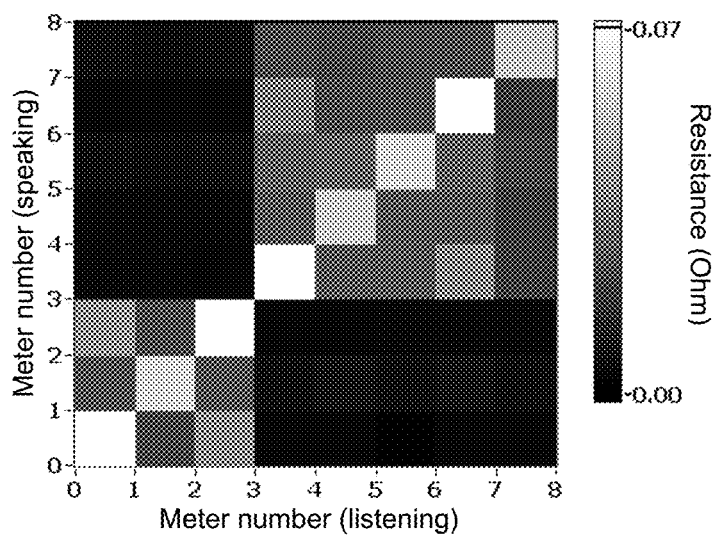
FIG. 6 is a graph illustrating an example of transfer function matrix.

In the context of this disclosure, for simplification purposes, a three-wire split-phase distribution network with a neutral is represented by a single-wire circuit. FIGS. 1, 2 and 3 show examples of electrical anomalies attributable to ENCs.

Referring to FIG. 1, a meter 5 is connected via a connection junction 11 to a low-voltage line 2 by a connection cable having a resistance $h_l$ 9 and supplying a load $L_l$ 101. A diversion 102 upstream of the meter 5 may be implemented by a connection 100 closer to the meter 5 than to the line 2 so that a resistance value between the connection 100 and the line 2 is lower than the value $h_l$ 9. The resistance k 9 divides into a resistance $h_{l1}$ 8 between the connection 100 and the network 2 and a resistance $h_{l2}$ 10 between the connection 100 and the meter 5 so that $h_l = h_{l1} + h_{l2}$, as illustrated in the detail on the left in FIG. 1. The diversion 102 supplies a load $S_l$ 105 independent from the load 101 supplied by the meter 5 and may be switched by a switch 104 or by removal/insertion of the connection 100.

Referring to FIG. 2, a bypass 106 of the meter 5 may be implemented by two connections 100, before and after the meter 5 so that a resistance $B_l$ 108 between the connections 100 is small and the resistance $h_{l2}$ 10 (as shown in FIG. 1) between the bypass connection 100 on the side of the low-voltage network 2 and the meter 5 is usually negligible with regard to $h_{l1}$ 8 (as shown in FIG. 1) because the connection 100 in question is most often located in the socket (not shown) supporting the meter 5. The bypass 106 at the same time supplies the load $L_1$ 101 with the meter 5 and may be switched by a switch 104 or by removal/insertion of one of the connections 100 or of both connections 100. The meter 5 may also be switched at its output by a switch 109. When both switches 104, 109 are closed, the ratio $(h_{l2}+A_l)/B_l$ determines a ratio of bypass current over current measured by the meter 5, where $A_l$ 107 represents a resistance value between the switch 109 and the meter 5.

Referring to FIG. 3, a connection problem may, among other things, be caused by a defective connection, a hot spot in the upper connection of the meter 5 to its socket (not shown) or a circuit breaker (not shown) of the meter 5 that has deteriorated. The connection problem may also originate from electricity theft means that are defective. This type of defect may be characterized by a variable resistance $F_l$ 113 across which a variable voltage drop appears. As it may be sensitive to wind, the temperature or the load, this type of anomaly may be reported for safety and service continuity reasons.

The cases portrayed in FIGS. 1, 2 and 3 may be combined together.

Table 1 hereinbelow lists measurements (electrical quantities) useful for implementing the invention.

TABLE 1

| Measurement description | Symbol | Unit |
|---|---|---|
| Timestamp | $t_m$ | AAAA, MM, JJ, HH, MM, SS |
| RMS voltage average | $v_m$ | Volts |
| Consumed energy | $E_m$ | kW-h |
| Power factor (optional) | $\lambda_m$ | dimensionless |

Figure 15:
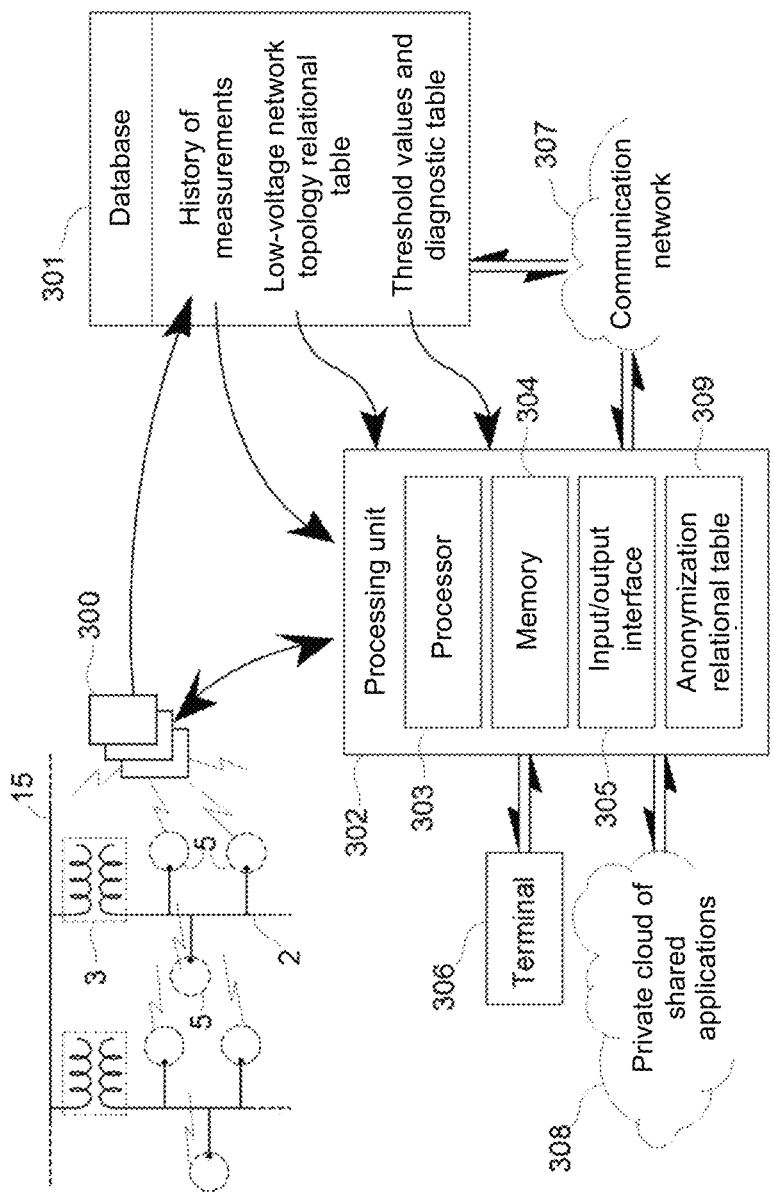
FIG. 15 is a schematic diagram illustrating an example of system that can implement the method according to the invention.

Referring to FIG. 15, an example of a system according to the invention is illustrated. The smart meters 5 queried on the network 2 integrate the active power and perform a calculation of the RMS voltage average over a typical 15 minutes interval and transmit the result, namely the energy E and the RMS voltage v for each meter 5 to a database 301. The timestamp corresponds to the time at the end of the integration period of the measurement. In the case of a three-wire split-phase distribution network having a neutral, the meters 5 usually do not transmit the measured values corresponding to each phase-neutral voltage but transmit a set of values equivalent to a single-phase network.

The invention is described hereinafter for a distribution network comprising only energy consumption sites. The invention may however be adapted for a distribution network comprising a mix of energy consumption and production sites.

The method according to the invention advantageously works for an integration interval of 15 minutes or shorter. A longer integration interval may reduce the information conveyed by the impact of the random switchings of the apparatuses connected to the network 2 on the measured voltages. With an hourly query, the profiles of current of the different meters 5 could be insufficiently dissimilar to characterize the impact of the consumption of each client on the network 2.

The current of a meter "i" for a timestamp $t_m$ may be calculated, for example, from the measurements such as $$c_{i,m} = \frac{p_{i,m}}{v_{i,m}} \cdot \frac{1}{\lambda_{i,m}}, \quad (1a)$$

with the active power $$p_{i,m} = E_{i,m} \cdot \frac{3600 \text{ s}}{\Delta t} \cdot \frac{1000 \text{ W-h}}{1 \text{ kW-h}},$$

where $\Delta t$ represents the integration interval expressed in seconds. (1b)

Depending on the calculation method of the RMS voltage used by the meter, a load imbalance causing an important neutral current for a split-phase network will introduce a bias in the calculations proposed at equations 1a and 1b. Furthermore, the power factor is modulated by the type of residential (or other) equipment switched and thus varies through time for each meter. A relative variation of the power factor with respect to its average may be neglected for equipments as refrigerators and freezers as they exhibit a uniform and relatively constant profile of use. However, heat pumps for heating or air-conditioning disturb the power factor by introducing fluctuations of a few percents in the estimate of the current according to equation 1a if the power factor is unknown. Regarding the industrial clients, a switching of reactive electrical equipments (inductive or capacitive) as a welding station sometimes significantly modulates the power factor of the installation. When the power factor is unknown, it may be set to a same plausible value for all the meters and this value will be constant through time. If $\lambda_{i,m}=1$, the current so calculated is slightly underestimated because the voltage $v_i$ is overestimated due to the contribution of the reactive power to this voltage. These underestimations and overestimations have no real importance in the calculation of the voltage drops deviations where the calculation of the voltage drop estimate is carried out by the product of the ohmic quantities by the currents, the underestimation of one compensating the overestimation of the other. In the following calculations, the power factor is set to one, and the reactive component of the meters as well as its addition on the low-voltage network are not considered.

In North America, half-phase meters are connected to one of the polarities and to the neutral thus having a 125 V supply. These half-phase meters usually supply a communication service provider. An algorithm detects this kind of situation by a measured voltage corresponding to the half-voltage of the phase. The voltage of a half-phase meter must then lay between two minimum and maximum thresholds typically respectively set to 45% and 55% of the phase voltage. The data can be discarded since these clients usually consume little power. Otherwise, the voltage measured by the meter can be doubled so that the resulting current will be twice lower, which does not bias the modeling. Indeed, in reality, a current is multiplied by a half-voltage while in the modeling, a half-current is multiplied by the full voltage. In both cases, the relative voltage drop observed on the phase is identical.

According to an embodiment of the method according to the invention, the calculation of the voltage and current quantities for each timestamp is followed by a step of qualification of the quantities to exclude those that appear invalid. For example, all the data associated to a timestamp are preferably excluded from a subsequent processing when one of the data associated to the considered timestamp exhibits an outlier. For example, an outlier may derive from a communication error or from a write error in the database 301 storing the data transmitted by the smart meters 5. For other types of invalidity grounds, the data may not be excluded from the totality of the processing. These data may be excluded from the modeling calculation while being preserved for display and calculations of deviation between the predictive and real values. In a possible embodiment of the invention, a vector mask(m) may be used in order to have a "true" state as value by default and set to "false" for timestamps corresponding to invalid data. For example, three types of invalidation ground of data may be qualified: the blackouts and power surges, grouped under a same "voltage anomaly" ground; the "communication synchronization losses between meters"; and the "unclassifiable various events". A voltage anomaly is detected for example when the voltage of a number of meters appears below a minimum threshold or above a maximum threshold set in absolute or set in proportion to the average voltage observed on a group of meters connected to a same transformer.

Typically, the low-voltage threshold may be adjusted to 90% of the average voltage observed on all the meters for the time length, and the surge threshold may be adjusted to 115%. A blackout occurring for less than 5% of the time in the integration interval (e.g. of 5 or 15 minutes) of the measurement taken by a meter may be not detected by a threshold overrun of 90%. Also, it is possible that an electrical perturbation is time-located at a boundary of two integration intervals and is detected only for one of the two intervals. As a precaution, the data located prior to and those located after an interval where the overrun is observed are preferably also excluded from the batch to be processed later, i.e. the mask(m) vector has values set to "false" on both sides of the area where a blackout/surge is detected. Synchronization losses of the meters occur during communication recovery after a blackout, a hardware modification or can be various and accidental. A comparison between the different voltage measurements allows quantifying the time differences between the voltage profiles and the timestamps attributed to them. As a first approximation, if the conduction losses are neglected, the voltage is determined by the output voltage of the transformer and thus appears relatively similar from one meter to another. It is the fluctuation of this voltage that may advantageously be correlated here as "bar code" between the meter readings in order to determine a time correspondence, said in synchronicity, of the meter measurements. In the case where the data are falsely date and time stamped for a few timestamps prior to and after detection of a synchronization loss, as a precaution, the data having a timestamp prior to, a timestamp during and a timestamp after detection of a synchronization loss are preferably removed. The time correspondence may be performed in the same step as that of a detection of the abnormal voltages or in another step, before or after. The detection and the removal of data deriving from unclassifiable various events (e.g. abnormal fluctuation of the voltage, temporary reconfiguration for works on the network, road accident, fire and electrical defect in a house, etc.) allows increasing the precision of the modeling. In an embodiment of the invention involving a first use of a model applied to a prediction of the voltage drops as a function of the measured currents, the deviations to the model are considered for each time interval. The method excludes the data corresponding to predictions too different from the measurements from a second calculation of the transfer function matrix. Typically, a maximum deviation threshold may be set manually or determined in order to eliminate 1% to 5% of the data. This functionality may be activated or not.

Referring to FIG. 4, there is illustrated a single-wire equivalent circuit of a low-voltage distribution network 1 connected to a transformer 3 and connecting by a line 2 meters 5 where measurements of voltage $v_i$ and of consumption p, are carried out. The segments connecting the equipments are considered to be resistive so that the segments of the line 2 between the connection junctions 11 of the meters 5 to the line 2 are represented with resistances 7 $[r_1, r_2, \ldots, r_i, \ldots, r_k, \ldots, r_I]$ while the segments between the meters 5 and the connection junctions 11 are represented by connection resistances 9 $[h_1, h_2, \ldots, h_i, \ldots, h_k, \ldots, h_I]$. In dotted lines in FIG. 4, any number of meters connected to line segments may be removed or added to this example of network. On the network 1 are I meters (clients) and an anomaly is represented in a simplified manner in the form of a non-compliant connection near the meter 5' of the client l in doubled line.

The voltage measured by the meter i on the low-voltage network 1 is given by $$v_i = V_0 - c_i \cdot h_i - \left( \sum_{j=2}^{i} \left( c_j \cdot \sum_{k=2}^{j} r_k \right) \right) - \left( \sum_{j=i+1}^{I} c_j \right) \cdot \left( \sum_{k=2}^{i} r_k \right) \quad (2)$$

where: $V_0$ represents the voltage at a reference node that may be, for example, the first meter connection 21 (as shown in FIG. 5A) or the first line junction 23 (as shown in FIG. 5B); $c_i$ represents the current in amperes attributed to the meter i; $h_i$ represents the resistance 9 of the connection 6 of the meter i to the low-voltage line 2; $r_i$ represents the resistance 7 of the conductor on the line section from i to i−1; and I represents the total number of meters connected to the line.

The resistance $r_1$ is not in the expression of equation 2 since this resistance is located upstream of the node corresponding to the reference voltage $V_0$ such that for this example of network, $v_1 = V_0 - c_1 \cdot h_1$ for the first meter, $$v_2 = V_0 - c_2 \cdot h_2 - c_2 \cdot r_2 - \left( \sum_{j=i+1}^{I} c_j \right) \cdot r_2$$

for the second meter downstream, and so on. In equation 2, if i corresponds to the last meter of the line 2, the right-hand term disappears since i=I.

In the linear system $v_i = f(V_0, c_0, c_1, \ldots, c_i, \ldots, c_I)$ presented at equation 2, there are I resistances $h_i$, I resistances $r_k$, I independent variables $c_i$, I dependent variables $v_i$ and one unknown $V_0$. The resistances are unknown values of the system and define the low-voltage network model. Initially, these resistances are considered to be constant by neglecting influences of load, temperature, aging, bad connections and hot spots.

In the case of an unmetered current $s_l$ at meter l (5') then $$v_i|_{i>l} = \quad (3a)$$
$$V_0 - c_i \cdot h_i - \left( \sum_{j=1}^{i} \left( c_j \cdot \sum_{k=1}^{j} r_k \right) \right) - \left( \sum_{j=i+1}^{I} c_j \right) \cdot \left( \sum_{k=1}^{i} r_k \right) - s_l \cdot \sum_{k=1}^{l} r_k,$$

$$v_i|_{i<l} = V_0 - c_i \cdot h_i - \left( \sum_{j=1}^{i} \left( c_j \cdot \sum_{k=1}^{j} r_k \right) \right) - \quad (3b)$$
$$\left( \sum_{j=i+1}^{I} c_j \right) \cdot \left( \sum_{k=1}^{i} r_k \right) - s_l \cdot \sum_{k=1}^{i} r_k$$

$$v_l = V_0 - c_l \cdot h_l - \left( \sum_{j=1}^{l} \left( c_j \cdot \sum_{k=1}^{j} r_k \right) \right) - \quad (3c)$$
$$\left( \sum_{j=l+1}^{I} c_j \right) \cdot \left( \sum_{k=1}^{l} r_k \right) - s_l \cdot \sum_{k=1}^{l} r_k - s_l \cdot h_{i1}.$$

All the voltages are affected by this unmetered current and in particular the voltage $v_l$ of the meter 5' bypassed by this current. By knowing the values of the resistances and the voltage $V_0$, an anomaly may thus be detected and even be quantified. In the following description, the above system of equations is manipulated in order to generalize it for any low-voltage network. There is proposed a simple means for obtaining a first estimate of the resistive values and the system of equations is referenced on the instantaneous average voltage obtained based on the meter measurements in order to eliminate $V_0$, the remaining unknown.

Equation 2 is reformulated by taking the currents calculated at equation 1a as independent variables and the $v_i$ as dependent variables. With the displacement of the variable $V_0$, the following matrix system of equations (row i, column j) is then obtained:

$$\left[\begin{bmatrix} 0 & 0 & \cdots & 0 & \cdots & 0 \\ 0 & r_2 & \cdots & r_2 & \cdots & r_2 \\ \vdots & \vdots & \ddots & \vdots & & \vdots \\ 0 & r_2 & \cdots & \sum_{k=2}^{i} r_k & \cdots & \sum_{k=2}^{i} r_k \\ \vdots & \vdots & & \vdots & \ddots & \vdots \\ 0 & r_2 & \cdots & \sum_{k=2}^{j} r_k & \cdots & \sum_{k=2}^{I} r_k \end{bmatrix} + \begin{bmatrix} h_1 & & & & \\ & h_2 & & 0 & \\ & & \ddots & & \\ & 0 & & h_i & \\ & & & & \ddots & \\ & & & & & h_I \end{bmatrix}\right] \cdot \begin{bmatrix} c_1 \\ c_2 \\ \vdots \\ c_i \\ \vdots \\ c_I \end{bmatrix} = \begin{bmatrix} V_0 - v_1 \\ V_0 - v_2 \\ \vdots \\ V_0 - v_i \\ \vdots \\ V_0 - v_I \end{bmatrix} \quad (4)$$

If this matrix system of equations is valid for the network illustrated in FIG. 4, it is not necessarily the case for other network configurations. However, the same mechanics of equations may be developed and applied for different network tree configurations such as those illustrated in FIGS. 5A and 5B.

The following generalized formulation may be extended to any tree-type network comprising I meters:

$$\left[\begin{bmatrix} r_{1,1} & r_{1,2} & \cdots & r_{1,i} & \cdots & r_{1,I} \\ r_{2,1} & r_{2,2} & \cdots & r_{2,i} & \cdots & r_{2,I} \\ \vdots & \vdots & \ddots & \vdots & & \vdots \\ r_{i,1} & r_{i,2} & \cdots & r_{i,i} & \cdots & r_{i,I} \\ \vdots & \vdots & & \vdots & \ddots & \vdots \\ r_{I,1} & r_{I,2} & \cdots & r_{I,i} & \cdots & r_{I,I} \end{bmatrix} + \begin{bmatrix} h_1 & & & & \\ & h_2 & & 0 & \\ & & \ddots & & \\ & 0 & & h_i & \\ & & & & \ddots & \\ & & & & & h_I \end{bmatrix}\right] \cdot \begin{bmatrix} c_1 \\ c_2 \\ \vdots \\ c_i \\ \vdots \\ c_I \end{bmatrix} = \begin{bmatrix} V_0 - v_1 \\ V_0 - v_2 \\ \vdots \\ V_0 - v_i \\ \vdots \\ V_0 - v_I \end{bmatrix} \quad (5)$$

or, in simplified form:

$$[R+h] \cdot C = \Delta V \quad (6)$$

where R is a matrix of resistances of low-voltage line segments and h is a diagonal matrix of connection resistances. These matrices contain the resistive values characterizing the network while the vector C contains the measured currents (e.g. calculated based on the measurements provided by the meters). The vector $\Delta V$ contains the deviations between the common voltage $V_0$ which is unknown and the voltages measured by the meters. The vector $\Delta V$ contains positive values since, in absence of distributed energy production from the consumers, $V_0 \geq v_i$. These positive values correspond to the line voltage drop from the node $V_0$ up to each meter.

In the following description, the set of measurements listed in table 1 regrouping the I meters of a network will be called "group of measurements" for a timestamp of index "m". For a set of M groups of measurements that may be successive or discontinuous:

$$Z \cdot C_m = \Delta V_m \quad (7a)$$

with $$Z = [R+h] = \begin{bmatrix} \ddots & \vdots & \cdot \cdot \cdot \\ \cdots & z_{i,j} & \cdots \\ \cdot \cdot \cdot & \vdots & \ddots \end{bmatrix} \quad (7b)$$

where Z is a ohmic matrix, $C_m = [c_{1,m}, \ldots, c_{j,m}, \ldots, c_{J,m}]$ is a vector of the meter currents with $c_{1,m} \geq 0$, and $\Delta V_m = [V_{0,m} - v_{1,m}, \ldots, V_{0,m} - v_{j,m}, \ldots, V_{0,m} - v_{J,m}]$ is a vector of the voltage drops observed at the different meters for the group of measurements m. $\Delta V_m = [0, \ldots, 0, \ldots, 0]$ for $C_m = [0, \ldots, 0, \ldots, 0]$ so that in absence of load, it is the voltage $V_{0,m}$ that is measured by all the meters. A particular property of the ohmic matrix Z is that it is symmetrical, i.e. $z_{i,j} = z_{j,i}$.

According to the linear hypothesis of Ohm law regarding the relationship of voltage at terminals of a resistance through which a current flows, the derivative $$\partial(Z \cdot C_m) = \partial(\Delta V_m) \quad (8a)$$

gives, whatever the current, $$Z \cdot \partial C_m = \partial \Delta V_m \quad (8b)$$

thus $$Z \cdot \begin{bmatrix} \partial c_{1,m} \\ \partial c_{2,m} \\ \vdots \\ \partial c_{i,m} \\ \vdots \\ \partial c_{I,m} \end{bmatrix} = \begin{bmatrix} \partial V_{0,m} - \partial v_{1,m} \\ \partial V_{0,m} - \partial v_{2,m} \\ \vdots \\ \partial V_{0,m} - \partial v_{i,m} \\ \vdots \\ \partial V_{0,m} - \partial v_{I,m} \end{bmatrix} \quad (8c)$$

For a voltage measurement of a meter i corresponding to the timestamp of index m, equations 7b and 8c give $$\partial v_{i,m} = \partial v_{0m} - \sum_j z_{i,j} \cdot \partial c_{j,m} \quad (9)$$

where $$\partial c_{j,m} = c_{j,m} - c_{j,m-1} \quad (10)$$

represents the time-series of the discrete derivatives on the current and $$\partial v_{i,m} = v_{i,m} - v_{i,m-1} \quad (11)$$

represents the time-series of the discrete derivatives on the voltage. The time-series $$\partial V_{0m} = V_{0m} - V_{0m-1} \qquad (12)$$

of the voltage derivatives at the transformer output is unknown.

$$H_{i,j} = -\frac{\sum_{m=1}^{M} \partial v_{i,m} \cdot \partial c_{j,m}}{\sum_{m=1}^{M} \partial c_{j,m}^2} \qquad (13a)$$

is an example of estimation of the transfer function between the I derivatives of current and the I derivatives of voltage for a term of the transfer function matrix $$H = \begin{bmatrix} \ddots & \vdots & \cdot^{\cdot^{\cdot}} \\ \cdots & H_{i,j} & \cdots \\ \cdot^{\cdot^{\cdot}} & \vdots & \ddots \end{bmatrix}. \qquad (13b)$$

The transfer function H may be further refined as described hereinafter. The negative sign in the formulation of equation 13a ensures that the terms $H_{i,j}$ have a positive value as mathematical expectation since, for a resistive load downstream of the meter j, the voltage derivative seen by any meter i is negative for an increase of current. The transfer function matrix is in Ohm units and it forms a ohmic matrix characterizing the network. The robustness of the transfer function estimation resides in that there is no matrix inversion that may lead to a singularity. The only division that may be zero is that by the sum of the squares of the derivative of current on all the meters. The probability that this sum of squares be zero is small and corresponds to an open circuit at all the clients.

Referring to FIG. 6, an example of transfer function matrix is illustrated where, by coincidental numbering of the meters, it appears that the transformer is connected to the 3/8 of the path of a low-voltage line with the meters 0-2 on one side and the meters 3-7 on the other side. There is appearance of symmetry on either side of the diagonal for this example.

By introducing equation 9 in equation 13a:

$$H_{i,j} = \frac{\sum_{m=1}^{M} \left( \partial V_{0m} + \sum_{n} z_{i,n} \cdot \partial c_{n,m} \right) \cdot \partial c_{j,m}}{\sum_{m=1}^{M} \partial c_{j,m}^2} \qquad (14a)$$

thus $$H_{i,j} = \frac{\left( \sum_{m=1}^{M} \partial V_{0m} \cdot \partial c_{j,m} \right)}{\sum_{m=1}^{M} \partial c_{j,m}^2} + \frac{\left( \sum_{n} z_{i,n} \sum_{m=1}^{M} \partial c_{j,m} \cdot \partial c_{n,m} \right)}{\sum_{m=1}^{M} \partial c_{j,m}^2} \qquad (14b)$$

by separating the terms. The term on the right corresponds to a common resistance $Z_0$ to all the meters, i.e. the resistance located upstream of the network. By supposing uncorrelated currents between the meters, this term statistically tends ($\Rightarrow$) towards the common resistance, i.e.

$$\frac{\sum_{m=1}^{M} \partial V_{0m} \cdot \partial c_{j,m}}{\sum_{m=1}^{M} \partial c_{j,m}^2} \Rightarrow Z_0, \forall j, \qquad (15)$$

with the terms of the transfer function defined by $$H_{i,j} \Rightarrow Z_0 + z_{i,j}, \forall i,j. \qquad (16)$$

The value of the common resistance $Z_0$ is the sum of the line resistance from the source upstream of the transformer (reported according to the transformation ratio or ratios) with the resistance of the transformer and the resistance between the transformer and the reference node. The estimated value of the transfer function obtained with expression 13a is all the closer to that given on the right of expression 16 that the currents measured between the meters do not significantly correlate with regard to their amplitude variability through time. The meters exhibiting little consumption will have very imprecise values in the row (index j) of the transfer function matrix H. Conversely, as little current flows through their connection, these same meters will be excellent voltage measuring means and will give more precise values in the column (index i) of the transfer function matrix H. As the transfer function matrix tends towards a symmetrical matrix, thus $H_{j,i}$, an off-diagonal term may be used to correct the opposite term $H_{i,j}$ by symmetry.

The estimated value of the transfer function obtained with expression 13a exhibits statistical artifacts generated by the cross-correlation between a current and the other currents and also between a current and the line voltage regulated upstream of the transformer. The temperature of the conductors and the power factor modulation as a function of the consumption patterns also influence the estimation of the transfer function. Different techniques of improving the estimation of the transfer function are possible as seen hereinafter.

The resistive coefficients $$z_{i,j} \cong H_{i,j} - Z_0 \qquad (17)$$

of the generalized ohmic matrix Z with the common resistance $Z_0$, an unknown resistive constant, are deduced from equation 16. The common resistance has a value close to the smallest values among the estimated terms of the transfer function matrix. The current-voltage relationship given at equation 6 is then rewritten:

$$\Delta V \cong Z \cdot C \text{ with } Z = \begin{bmatrix} \ddots & \vdots & \cdot^{\cdot^{\cdot}} \\ \cdots & H_{i,j} - Z_0 & \cdots \\ \cdot^{\cdot^{\cdot}} & \vdots & \ddots \end{bmatrix} \text{ and where} \qquad (18a)$$

$$\Delta V = [V_{0m} - v_{1,m}, \ldots, V_{0m} - v_{j,m}, \ldots, V_{0m} - v_{J,m}], \qquad (18b)$$

which gives $$V_{0m} - \sum_{j} (H_{i,j} - Z_0) \cdot c_{j,m} \Rightarrow v_{i,m} \qquad (19)$$

as relationship with the voltage measured at meter i. An instantaneous voltage estimate obtained with the model is given by $$v'_{i,m} = V_{0m} - \sum_j (H_{i,j} - Z_0) \cdot c_{j,m} \quad (20)$$

such that $v'_{i,m} = V_{0m}$ when $c_{i,m}=0$ and $v'_{i,m} < V_{0m}$ when $\{\forall_{i,m}|c_{i,m}>0\}$.

The difference between the instantaneous voltage of meter i and the average voltage of the meters $$\Delta v_{i,m} = v_{i,m} - \bar{v}_m \quad (21)$$

with the instantaneous average voltage $$\bar{v}_m = \frac{1}{I} \sum_{j=1}^{I} v_{j,m} \quad (22)$$

is called "relative voltage" in the context of this disclosure. The relative voltage is zero in the case of a single meter connected to the transformer (i.e. I=1). The detection of ENCs thus involves a low-voltage network with 2 or more meters. By combining equations 20, 21 and 22, the estimate of the instantaneous relative voltage at meter i is given by:

$$\Delta v'_{i,m} = \quad (23)$$

$$V_{0m} - \sum_j (H_{i,j} - Z_0) \cdot c_{j,m} - \frac{1}{I} \sum_{n=1}^{I} \left( V_{0m} - \sum_j (H_{i,j} - Z_0) \cdot c_{j,m} \right)$$

which finally gives after some manipulations:

$$\Delta v'_{i,m} = -\sum_j \left( H_{i,j} - \frac{1}{I} \sum_{n=1}^{I} H_{i,j} \right) \cdot c_{j,m} = -\sum_j \Omega_{i,j} \cdot c_{j,m} \quad (24)$$

where $$\Omega_{i,j} = H_{i,j} - \frac{1}{I} \sum_{j=1}^{I} H_{i,j}. \quad (25)$$

The introduction of the relative voltage (equation 21) allows eliminating two unknowns, namely the common resistance $Z_0$ 15 and the voltage $V_{0m}$ at the reference node. If desired, the introduction of the relative voltage may be carried out before the step of the transfer function estimation (equation 13a), giving the same result.

Equation 25 defines the "relative ohmic matrix" $\Omega_{i,j}$. The qualifier "relative" is attributed from the fact that this matrix multiplied by the currents gives the relative voltages and as the sum of the relative voltages is zero, the sum of the matrix terms according to a row (index j) is zero.

Figure 7:
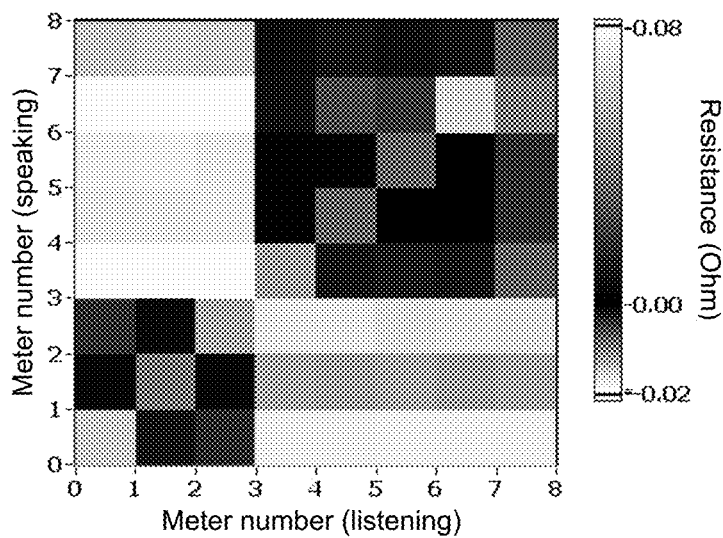
FIG. 7 is a graph illustrating a relative ohmic matrix corresponding to the transfer function matrix illustrated in FIG. 6.

Referring to FIG. 7, an example of relative ohmic matrix is illustrated. The terms on the diagonal are positive while the off-diagonal terms are negative for the most part. On a color scale, the negative values may be colored e.g. in red. The meter count starts at zero for the numbering of the meters for each axis. In comparison to the ohmic matrix given at equation 7, the relative ohmic matrix given at equation 25 is not symmetrical due to the terms subtracted in equation 25 that cannot be equal if there is at least one meter having a connection different from the other meters. In the present disclosure, the use of the term "ohmic matrix" encompasses the generalized ohmic matrix Z, the transfer function matrix H and the relative ohmic matrix $\Omega$.

Prior to comparing the modeled voltage drops with the measured ones in order to detect the ENCs, the voltage measurement relative systematic deviations with respect to the average voltage determined from all the meters or a subset of meters are determined and minimized. A method for estimating the calibration coefficients $\alpha_i$ usable to correct the sensitivity of the voltage measurements of the meters is described in the application PCT/CA2017/050448 (Leonard et al.).

Over a long period of time, meters of a same batch and same manufacturer brand will exhibit calibration factor deviations as a function of the temperature intensified by the fact that some of the meters are located outside while others are in a heated or partially heated building. Calculating and evolving the values of the coefficients as a function of the temperature brings more precision at the cost of a more complex implementation. It is desirable to tie the calibration coefficient calculation method to that of the transfer function matrix with regard to the binning of the modeling as a function of the temperature.

To correct the voltage measurement of a meter, a calibration coefficient $\alpha_i$ is inserted in equations 21-22, respectively giving the relative voltage value $$\Delta vv_{i,m} = (1+\alpha_i) \cdot v_{i,m} - \overline{vv}_m \quad (26)$$

and the instantaneous average voltage $$\overline{vv}_m = \frac{1}{I} \sum_{j=1}^{I} (1 + \alpha_i) v_{j,m} \quad (27)$$

with $\alpha_i$ a calibration coefficient such that in absence of an anomaly $|\alpha| \leq 0.002$ for a meter of Class 2 (0.2%), the sum of the coefficients $\alpha_i$ being zero.

The voltage difference observed between the relative voltage determined from the corrected measurement (eq. 26) and the estimate of the relative voltage (equation 21)

$$\Delta\Delta v_{i,m} = \Delta vv_{i,m} - \Delta v'_{i,m} \quad (28)$$

gives a first overview of the possibilities of ENCs. A negative difference of that stands out means the probable presence of an ENC, the measured voltage drop being greater than the estimated voltage drop. The double delta denomination is explained by a difference between two voltages that are themselves differences with respect to an instantaneous average voltage. The signal corresponding to the ENC as observed by the calculation of the voltage difference $\Delta\Delta v_{i,m}$ is present for all the voltage measurements, is more important in amplitude where there is an ENC at the meter of a client or close to this meter, decreases upstream (towards the transformer) from the ENC, and is constant downstream of the connection point of the ENC.

In this voltage difference, the unknown of the diversion connection distributing the resistance $h_I$ between $h_{I1}$ and $h_{I2}$ (as shown in FIG. 1) is not considered. The voltage difference is slightly underestimated by a ratio $h_{I2}/H_{I,i}$ where a diversion 102 as shown in FIG. 1 is located. From this voltage difference is calculated the corresponding current $$s_{i,m} = -\sum_j [\Omega_{i,j}]^{-1} \cdot \Delta\Delta v_{j,m} = \qquad (29)$$

$$-\sum_j [\Omega_{i,j}]^{-1} \cdot \left( (1+\alpha_i) \cdot v_{i,m} - \overline{v}v_m - \sum_j \Omega_{i,j} \cdot c_{j,m} \right)$$

unmetered by the meter i where $(\ )^{-1}$ is a pseudo-inverse matrix operator. The matrix $[\bullet_{i,j}]^{-1}$ forms the inverse transform, i.e. a transform having the instantaneous relative voltage drops of the meters as input and the corresponding unmetered currents as output. The relative ohmic matrix obtained from the measurements on the network is usually not reversible and only a pseudo-inverse allows getting close to a plausible solution. When several meters are very close together, such as in a rental building where the meters are connected to a same distributor, the rows of these meters are similar in the matrix so that the matrix cannot be reversed. These meters may then be grouped together into a single representative meter (average of voltages and sum of currents) and the meters so regrouped are replaced by the representative meter in order to allow an inversion of the relative ohmic matrix. When it is impossible to reverse the matrix or for any other reason, the estimate of the non-compliance current $$s_{i,m} = k_{\Omega,i} \cdot \frac{\Delta\Delta v_{i,m}}{H_{i,j}}, \qquad (30)$$

may be used, although it gives a less precise result, with the correction factor $k_{\Omega,i} \approx 1$. In the context of the present disclosure, this method is called "inverse diagonal". The factor $$k_{\Omega,i} \approx \frac{H_{l,l}}{H_{l,l} - h_{l2}}$$

may be left to 1.0 or, for a more precise result, manually or automatically adjusted, the optimization criterion being a maximum reduction of the RMS voltage residue after modeling of the voltage drops attributable to the measured currents added to the estimates of unmetered currents, thus the minimization of $STDV_{\Delta\Delta|s}^2$ presented hereinafter at equation 47. The optimal factor $k_{\Omega,i}$ is not necessarily greater than one because it does not solely depend on the distribution of the resistance $h_t$ between $h_{t1}$ and $h_{t2}$. Among other things, it also corrects the statistical artifacts biasing the estimates of the terms of the transfer function matrix.

By referencing the network of resistances at another voltage, another matrix model equivalent to that presented above may be obtained. For example, another solution is to write the model such as $$H \cdot \begin{bmatrix} c_{1,m} \\ c_{2,m} \\ \vdots \\ c_{i,m} \\ \vdots \\ c_{I,m} \end{bmatrix} = \begin{bmatrix} V_{Sm} - v_{1,m} \\ V_{Sm} - v_{2,m} \\ \vdots \\ V_{Sm} - v_{i,m} \\ \vdots \\ V_{Sm} - v_{I,m} \end{bmatrix} \qquad (31)$$

where $V_{Sm}$ is the voltage of a reference node associated to the power generating source of the electrical network, at the end of the line upstream of the transformer, reported in low-voltage according to the transformation ratio. As $V_{0m}$, this value is unknown. By replacing relation 20 by $$v'_{i,m} = V_{Sm} - \sum_j H_{i,j} \cdot c_{j,m} \qquad (32)$$

as estimated value of voltage at meter i, and by choosing relations 21 and 22 for defining the relative voltage, the expression $$\Delta v'_{i,m} = V_{Sm} - \sum_j H_{i,j} \cdot c_{j,m} - \frac{1}{I} \sum_{n=1}^{I} \left( V_{Sm} - \sum_j H_{i,j} \cdot c_{j,m} \right) \qquad (33a)$$

is obtained in replacement of relation 23, giving a relative ohmic matrix $\Omega_{i,j}$ identical to that obtained at relation 25. The reference voltages $V_{0m}$ and $V_{Sm}$ of these two models are linked by the relation $$V_{Sm} = V_{0m} + Z_0 \cdot \sum_j c_{j,m} \qquad (33b)$$

with $$Z_0 = \frac{\sum_{j=1}^{I} \sum_{m=1}^{M} \partial V_{0m} \cdot \partial c_{j,m}}{\sum_{j=1}^{I} \sum_{m=1}^{M} \partial c_{j,m}^2} \qquad (33c)$$

as suggested estimation for the common resistance value.

The relative voltage deviations can be considered not at each meter but with respect to a reference voltage $V_{0m}$, $V_{Sm}$ or other estimate according to a meter i. For example, for the second model, the instantaneous relative voltage deviation $$\Delta V_{Si,m} = \overline{V}_{Sm} - \left( v_{i,m} + \sum_{j=1}^{I} H_{i,j} \cdot c_{i,m} \right). \qquad (34a)$$

is considered with $$\overline{V}_{Sm} = \frac{1}{I} \sum_{i=1}^{I} \left( v_{i,m} + \sum_{j=1}^{I} H_{i,j} \cdot c_{i,m} \right) \qquad (34b)$$

for developments similar to those presented for the two previous models, which end up also into a relative ohmic matrix $\Omega_{i,j}$ as that obtained at relation 25. In fact, there is a plurality of models as a function of the position of the voltage reference (i.e. reference node used). What is common to the models is that they correspond to a matrix of resistances with a voltage referenced to a reference node set on the network and that they can be utilized by using an instantaneous relative voltage defined as a voltage difference between that determined according to a meter and that determined according to all the meters or a subset thereof.

If an estimated non-compliance current appears significant for the meter l (as shown in FIG. 4), then the estimate (equation 29 or 30) of the non-compliance current is added to the measured current (equation 1a) and H is recalculated, for example according to equation 13a, in order to obtain more precise terms. The discrete derivative of current $$\partial cs_{i,m} = cs_{i,m} - cs_{i,m-1} \qquad (35)$$

such that $$cs_{i,m} = c_{i,m} + \delta(i-l) \cdot s_{i,m}, \; \delta(x) = \begin{cases} 0 & x \neq 0 \\ 1 & x = 0 \end{cases} \qquad (36)$$

may then be used in the estimation of the transfer function H proposed at equation 13a for a single ENC on the network. In the context of the present disclosure, this transfer function estimated by considering one or more estimations of ENCs is called Hs. In the formulation given at equation 36, the addition of a single unmetered current $s_{l,m}$ is allowed. In the case where more than one ENC is suspected on the same low-voltage network, equation 35 may include more than one estimation of ENC current.

The estimation error of a calibration coefficient $\alpha_i$ translates into a constant bias in the electricity theft current determined with equation 29. For example, if this coefficient is estimated from groups of measurements where the unmetered current is constant for a client, the coefficient will include an estimation error that will correct the voltage drop caused by this unmetered current. A negative current will then appear at the time when there is no longer unmetered current. The variation of unmetered current determined with equation 29 is accurate close to a constant additive error that cannot be avoided.

The calculation method given at equation 29 cannot be directly applied in the case of an electricity theft by bypass. If the values of the terms of the transfer function matrix are not or only slightly affected by a diversion, however, these terms are significantly modified in the case of a bypass. Typically, the auto-term of the contravening meter increases in the same ratio as that of the electricity theft current over the total current. If another meter is located close to the contravening meter, then equation 29 applied to this neighboring meter gives an overview of the current stolen by the contravening meter. Recognition of a bypass may be achieved by noting that the electricity theft current determined by equation 29 for the meter i corresponds to the current measured by the contravening meter l close to a multiplicative factor $k_l$. The bypass factor may be estimated in different ways. For example, when the neighboring meter i allows estimating the current stolen by the meter l then $$s_{l,m} = s_{i,m} \qquad (37)$$

such that $$k_l = s_{i,m}/c_{l,m} \qquad (38)$$

or else the factor $k_l$ that symmetrizes the row and the column corresponding to the contravening meter l may be found such that $$s_{l,m} = k_l \cdot c_{l,m} \qquad (39)$$

with $$k_l = \frac{\sum_{j=1}^{I} H_{i,l} - H_{l,l}}{\sum_{i=1}^{I} H_{l,i} - H_{l,l}} \qquad (40)$$

Whether for one or the other of the two bypass estimation methods, the transfer function matrix may either be re-estimated (e.g. with equation 13a) from the corrected values of current (by eq. 37 or 39) or corrected with $$Hs_{i,j} = \begin{cases} H_{i,j}/k_l & \text{for } j = l \\ H_{i,j} & \text{for } j \neq l \end{cases} \qquad (41)$$

so that for a bypass, there is addition of the electricity theft current and also re-estimation or correction of the transfer function matrix. The modeling precision increase brought by introducing the distribution of resistance $h_l$ between $h_{l1}$ and $h_{l2}$ in the developments of relations 37 to 41 is often minor compared to the contribution of the other sources of errors. The correction of the transfer function (equation 41) gives in practice good results when the bypass is constant through time.

The modeling of the electricity theft may sometimes be more complex than that presented at equations 34a, 34b and 35. For example, in the case of a dual energy system that disconnects the electrical elements at a temperature lower than −12° C. to activate fossil-fuel heating, an alternating diversion may be added to the dual energy system by switching the electrical elements upstream of the meter rather than disconnecting them. The electricity theft is then discontinuous. In other cases, both types of electricity theft, diversion (equation 30) and bypass (equation 39) are simultaneously operated and vary in proportion through time. If the detection of the presence of electricity theft is usually easy, it is possible that its quantification requires an unprofitable or unrealistic modeling effort Referring to FIG. 3, the identification of a connection defect or a hot spot in a connection of a meter to the socket is simple. The voltage deviation (equation 28) is significant only for the candidate where the defect occurs. The terms of the row corresponding to the meter where the defect occurs will time-vary with the fluctuations of the defect. A connection defect or a hot spot being a complex phenomenon and having a hardly predictable evolution, its modeling is of little relevance. However, for a time interval when the defect appears to be stable, an instantaneous correction of the auto-term of the transfer function matrix may be brought by adding to it the instantaneous resistance $F_{l,m}$ 113 corresponding to the voltage drop as a function of the time such as $$H_{l,l,m} = H_{l,l} + F_{l,m} - H_{l,l} - \Delta\Delta v_{l,m}/c_{l,m}. \qquad (42)$$

Once Hs is estimated, the calculation of the deviation to the average voltage $$\Delta vs'_{i,m} = -\sum_j \left( Hs_{i,j} - \frac{1}{I}\sum_{n=1}^{I} Hs_{n,j} \right) \cdot cs_{j,m} \qquad (43)$$

(from equation 26) is carried out, and the prediction error calculation of the voltage deviation to the average voltage $$\Delta\Delta vs_{i,m} = \Delta vv_{i,m} - \Delta vs'_{i,m} \qquad (44)$$

(from equation 28) is carried out to finish with the calculation of the residual electricity theft currents $s_{i,m}$ (equation 29 or 30) considering $\Delta\Delta vs_{i,m}$ instead of $\Delta\Delta v_{i,m}$. If the estimate of the unmetered current is precise, then the voltage deviations observed for the faulty meter decrease as well as the deviations for other meters impacted by the unmetered current. A success criterion may thus be the minimization of the deviations between the model and the measurement. An estimation by successive approximations may be applied with the input of other action variables (e.g. value of $h_{l,1}$, effect of the temperature on the network and on the voltage reading of the meters) in the modeling.

A process to minimize the standard deviation $$STDV_{\Delta\Delta}^2 = \frac{1}{I \cdot M} \sum_i \sum_m \Delta\Delta v_{i,m}^2, \quad (45)$$

calculated on all the valid records and valid meters may advantageously be used. To figure out a relative precision of the model, this standard deviation may be compared with $$STDV_{\Delta}^2 = \frac{1}{I \cdot M} \sum_i \sum_m \Delta v_{i,m}^2, \quad (46)$$

thus the total standard deviation of the relative voltages. Likewise, to estimate a precision gain of the model considering the addition of the non-compliance currents, the residual standard deviation $$STDV_{\Delta\Delta|s}^2 = \frac{1}{I \cdot M} \sum_i \sum_m \Delta\Delta vs_{i,m}^2, \quad (47)$$

may be compared with $STDV_{\Delta\Delta}$. The estimation of the non-compliance currents is not valid when $STDV_{\Delta\Delta|s} > STDV_{\Delta\Delta}$, and for a ratio $STDV_{\Delta\Delta|s}/STDV_{\Delta\Delta}$ lower than 0.5, the estimation of the non-compliance currents is considered to be credible. A ratio $$R = 100 \cdot STDV_{\Delta\Delta}/STDV_{\Delta}(\%) \quad (48)$$

may form an important indicator of possible ENCs on a network. Typically, a ratio of 10% or less is observed for the networks well modeled by the method since without major anomaly. A ratio over 30% is an indicator of an ENC disturbing the prediction of the model or a statistical artifact biasing the modeling. For example, in a case of intensive marihuana grow-up where from 75 A to over 150 A are stolen according to a daily cyclic pattern and a cyclic harvest pattern (60 to 90 days), the ratio R may be close to 100% of error or even higher on occasion.

In the case of an ENC corresponding to a bypass 106 (as shown in FIG. 2), the residual error $STDV_{\Delta\Delta|s}^2$ is not or only slightly modified by a variation of the bypass factor $k_l$. It may be appropriate to look, among other things, on the side of the apparent resistance as described in the application PCT/CA2017/050448 (Leonard et al.) and of the dissymmetry of the transfer function matrix to have an indicator of the quality of the bypass modeling.

The introduction of more than one model of ENCs for a same low-voltage network involves a simultaneous adjustment of the parameters of the models (e.g. choice of model and factor $k_{\Omega,i}$). In addition to a manual adjustment by trial and error, different optimization methods may be implemented. Among the optimization criteria, there is, among other things, the minimization of the residual error $STDV_{\Delta\Delta|s}^2$ including the contribution of all the models of ENCs, there is the matrix symmetrization of the transfer function, the elimination of negative terms (negative resistances) on the diagonal (auto-terms) of the transfer function matrix, the reduction of the dispersion of the transfer function matrix and the increase of the correlation as well as the coherence of a meter having its current corrected with respect to itself and the others as seen hereinafter.

From a diagnostic tool point of view, a visualization of the transfer function matrix may be advantageous with respect to a visualization of the relative ohmic matrix. Indeed, in the case of a successful modeling of a network having no ENCs with all the meters being smart and connected to the modeled network, the transfer function matrix is very close to be symmetrical with respect to its diagonal, as illustrated in FIG. 6, which is not the case of the ohmic matrix as illustrated in FIG. 7. At first glance at the graphical rendering of the transfer function matrix, the quality of the modeling may be ascertained and the meters exhibiting modeling anomalies or yet those that possibly correspond to an ENC, as a meter not connected to the network, may be targeted. In the example given at FIG. 6, the transformer is located to the 3/8 of the path of the line supplying meters 0, 1 and 2 on one side and meters 3 to 7 on the other side. In this case, the darker inter-terms between the two groups of opposite meters, namely the $H_{i,j}$ and $H_{j,i}$ for which $i \in [0,1, 2]$ and $j \in [3, \ldots, 7]$, gives the common resistance value $Z_0$ (typically a little less than $0.01\Omega$) at the connection point 23 of both line sections (as illustrated in FIG. 5B).

Referring to FIG. 6, in the transfer function matrix, an axis of the matrix expresses the influence that a current of a given meter has on the voltage of the meters while the other axis expresses the influence that the currents of the meters have on the voltage of a given meter. This is why, in the matrix illustrations, the names of "speaking" meter and "listening" meter have respectively been given to the axes.

The statistical reality results in that negative matrix terms for the transfer function may be observed, even if it is unconceivable from a physical point of view that a conductor has a negative resistivity or yet, that the voltage increases when the current increases. In a color graphical implementation, these terms can be drawn e.g. in red to clearly distinguish them from the other positive terms. Negative terms are for example observed when meters supply the heating of adjoining areas as existing in a rental building. There is a struggle between the common heating and the heating of the apartments when the rental heatings are activated and that of the common area stops, the meter supplying the heating of the common area then sensing a decrease of the voltage with the decrease of its load-flow current. Negative terms are also observed for city lighting or rental space where a lighting unit switches off in the morning at the beginning of peak hour (in increase of current) and switches on at the end of the peak hour (in decrease of current). A meter connected to a transformer other than that of the modeled network may also explain the presence of negative terms for the off-diagonal terms when this meter is "speaking" or "listening". The transfer function matrix as estimated from equation 13a expresses a statistical reality built from a set of measurements of current that are not decorrelated between them, so that certain inter-correlations generate values far from the reality expected for an electrical circuit. The matrix terms get closer to the resistive reality of the network for clients where significant currents are randomly switched. The clients having a consumption according to a programmed daily schedule or that share a common process (air conditioning, heating or lighting) with other clients are more likely to have matrix terms diverging from the resistive reality of the network.

Despite the artifacts occasionally generated by an inter-correlation of the loads through time, the comparison of the resistance of the inter-terms between different meters allows identifying a meter that is not connected with the modeled low-voltage network, the meters that are regrouped or close together and those that are alone, a defective meter, an electricity theft by bypass, a defective connection, and a hot spot in an connection socket of a meter.

Figure 8:
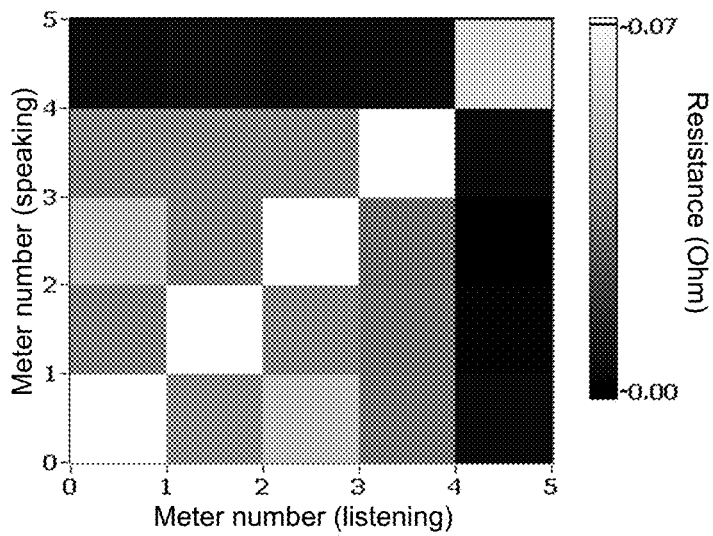
FIG. 8 is a graph illustrating an example of transfer function matrix obtained for 5 meters where the last one is in reality not connected to the same transformer as the four other meters.

Referring to FIG. 8, there is illustrated an example of transfer function matrix obtained for 5 meters where the last meter (#4) is in reality not connected to the same transformer as the other four meters. It is noted that if the auto-term $H_{4,4}$ has a lower value than the others but nevertheless plausible, the off-diagonal terms associated to this meter are close to zero because in "listening" mode, meter #4 only hears itself and in "speaking" mode, the other meters do not hear it. For this example, there are greenhouse cycles determined according to equation 29 for a diversion at the first meter (#0). This example also shows that a diversion, as well as the presence of an unmetered current (electromechanical meter, flat-rate meter-less connection, etc.) is not highlighted by the transfer function matrix. It is the use of this matrix that allows highlighting the unmetered currents.

Figure 9A:
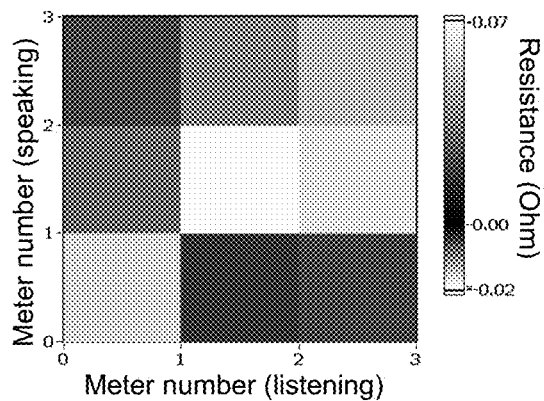
FIGS. 9A and 9B are graphs illustrating an example of transfer function matrix obtained for 3 meters, without and with proportional increase of the current measured by meter #1.
Figure 9B:
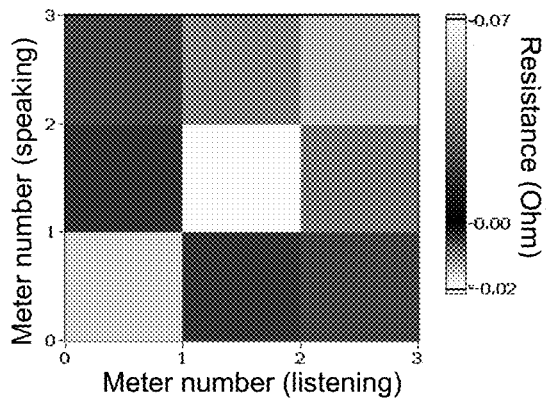

Referring to FIG. 9A, an example of transfer function matrix obtained for 3 meters where a dissymmetry of the off-diagonal terms is observed for meter #1 is illustrated. If the measured current of this meter is proportionally increased by 80%, the transfer function illustrated in FIG. 9B is obtained and appears more symmetrical. For the terms where the meter is "speaking", thus row 1 of the matrix, a bypass decreases the measured value of current without affecting the voltage measurement. For all the meters, the resistive values of the corresponding row on the transfer function are increased according to the "real current"/"measured current" bypass ratio.

Figure 10:
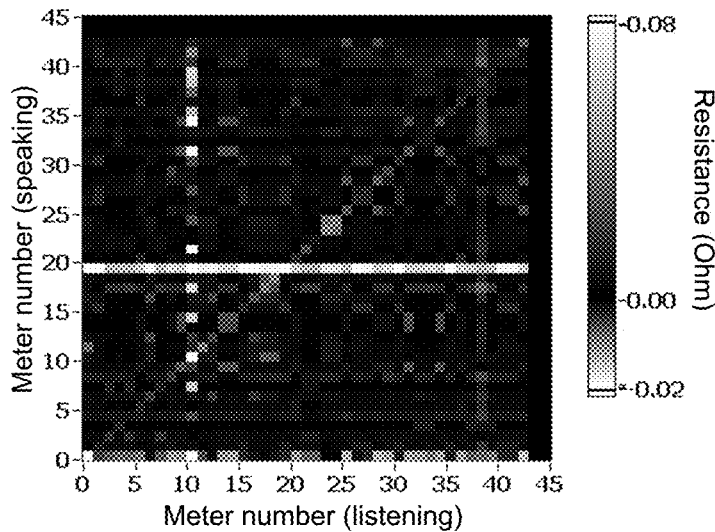
FIG. 10 is a graph illustrating an example of transfer function matrix obtained for 43 meters where three anomalies appear.

Referring to FIG. 10, an example of transfer function matrix obtained for 43 meters where three anomalies appear is illustrated. The first anomaly, the most visible one, is an horizontal line coinciding with meter #19 and corresponds to a statistical outlier. The statistical outlier is explained by the prevailing influence of a lighting timer on the derivative in current of meter #19. This meter is excluded from the calculation of the estimates of the unmetered currents. The second anomaly is a vertical discontinuous line coinciding with meter #10 and is explained by the presence of a hot spot at the upper connection of the meter confirmed by an on-site inspection. If the presence of a hot spot does not influence the measurement of current of the meter, it however biases its voltage measurement. In "listening" mode, meter #10 senses the voltage drops generated by the currents of the other meters subtracted from the more or less random voltage present at the terminals of the hot spot. The voltage drops of the other meters thus appear not very coherent with the currents flowing, thereby increasing the fluctuation of the resistive value of the corresponding term in the transfer function. The third anomaly is a horizontal discontinuous line coinciding with meter #0. This meter carrying almost no current, the terms where it is "speaking" have wrong estimates.

The transfer function matrix contains the information relating to the distribution of the voltage drops on the network as a function of the load-flow currents. This information forms a useful indicator for performing a diagnosis of ENCs. The fluctuations disturbing the transfer function form complementary indicators. Different means for assessing the fluctuations disturbing the transfer function may be used, as the calculation of dispersion, the inter-correlation and the coherence.

$$\sigma_{i,j} = \frac{1}{H_{i,j}^{(1)}} \cdot \sqrt{\frac{1}{M-1} \cdot \frac{\sum_{m=1}^{M} (\partial c_{i,m} \cdot H_{i,j} - \partial v_{j,m})^2}{\sum_{m=1}^{M} \partial c_{i,m}^2}} \quad (49)$$

provides an estimate of the relative dispersion on the transfer function $H_{i,j}$. Typically, a relative dispersion of less than a tenth corresponds to a good estimation (10% of dispersion). In a first aspect, the relative dispersion calculation allows assessing the precision of the estimate of each of the terms of the transfer function matrix and assessing the quality of the modeling. In a second aspect, by order of sensitivity from + to ++++, the relative dispersion between different meters is influenced by: a contributing meter in the transfer function which is not connected to the modeled low-voltage network (++++) (meter-transformer pairing error); a current unmetered by the meters taken into account in the transfer function (electromechanical meter, flat-rate connection or diversion) (++); an ENC similar to a bypass (+); an electricity theft with regular switching of the stealing means (++++); and a connection defect or a hot spot (+++).

The meters with small load-flow currents will have important relative dispersion values entered in their row in "speaking" mode while in "listening" mode, according to the corresponding column, they will exhibit a small relative dispersion. Usually, the dispersion is smaller for the diagonal terms since the meters are both "speaking" and "listening" with the connection resistance 9 (shown in FIG. 4) as amplification of the delta-current to delta-voltage relationship. Apart from its diagonal term, a meter not connected to the network exhibits an important relative dispersion for the row and the column because it has no significant cause and effect relationship with the other meters. The only inter-correlation subsisting between a meter outside the network is that with the average profile of the daily load cyclic variation and this inter-correlation may give resistance values either negative or positive, depending on the prevailing statistical artifacts.

Another means for measuring the quality of the modeling, for detecting and characterizing ENCs is by a calculation of the inter-correlations between the voltage variations and the variations of current. The correlation between current and voltage $$\eta_{i,j} = \frac{\left| \sum_{m=1}^{M} \partial c_{i,m} \cdot \partial \hat{v}_{j,m} \right|}{\sqrt{\sum_{m=1}^{M} \partial c_{i,m}^2 \cdot \sum_{m=1}^{M} \partial \hat{v}_{j,m}^2}} \quad (50)$$

corresponds to the Bravais-Pearson relationship, by proposing that $$\sum_{m=1}^{M} \partial \hat{v}_{i,m} \cong 0$$

and $$\sum_{m=1}^{M} \partial c_{j,m} \cong 0, \quad (5)$$

for which an absolute value is added for user-friendly purposes for graphical display. The significant current consumers will have an important autocorrelation, thus getting close to or over 0.5 on the diagonal of the correlation matrix generated with equation 50. The off-diagonal values of the correlation matrix are usually well below 0.5. The meters close together will have higher off-diagonal common terms. The correlation gives weight to the likelihood of an unmetered current. When the addition of the unmetered current (equation 29) to the correlation calculation increases the correlation of a meter with respect to itself and the others, it gives credibility to the estimate of this current.

In a multidimensional representation, the correlation may be seen as a vector collinearity measurement between the vector of current and the voltage vector. The relative magnitude of the vectors is not taken into account.

The coherence calculation $$\gamma_{i,j} = \sqrt{\frac{\left(\sum_{m=1}^{M} \partial \hat{v}_{i,m} \cdot \partial c_{j,m}\right)^2}{M \cdot \sum_{m=1}^{M} (\partial \hat{v}_{i,m} \cdot \partial c_{j,m})^2}} \quad (51)$$

provides an information slightly different from the correlation. Indeed, in multidimensional representation, the coherence is equal to a ratio of the length of the vector resulting from the sum of the contributing vectors over the sum of the lengths of these vectors. A contributing vector corresponds here to the term-to-term product of the vector of current and the voltage vector. Unlike the correlation, the magnitudes are not contributing, which often makes the coherence a better ENC characterization tool.

Figure 11A:
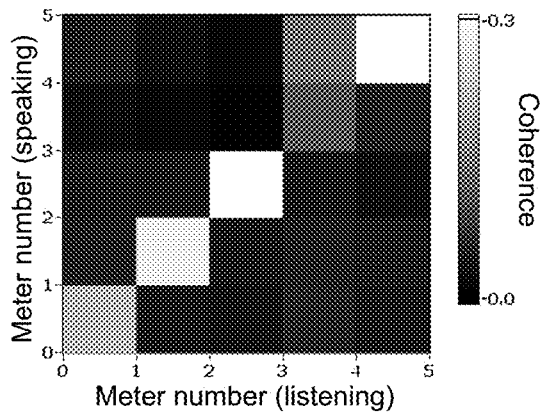
FIGS. 11A and 11B respectively give an example of coherence matrix and an example of relative dispersion matrix of the transfer function of a same case where meter #3 is seen as a probable ENC.
Figure 11B:
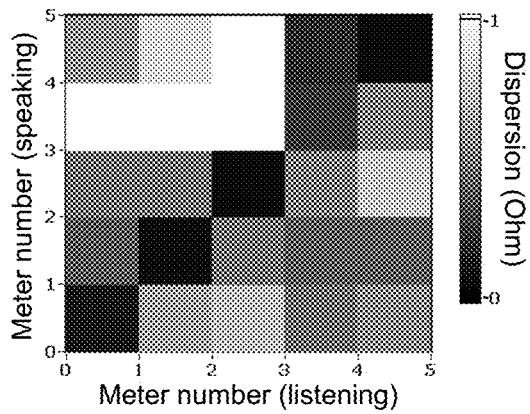

FIG. 11A illustrates an example of coherence matrix. In black and white tones, the correlation matrix appears similar while with a color rendering (not shown), the difference may be observed. Usually, for a color rendering, the result obtained with the coherence matrix is preferred. In the case shown in FIG. 11A, meter #3 is seen as a probable ENC that exhibits a low auto-coherence and almost no inter-coherence. The relative dispersion of the transfer function of the same case illustrated in FIG. 11B shows that the dispersion of the auto-term (diagonal term) of meter #3 is the highest one and that the off-diagonal terms of this meter in "speaking" mode are much higher than those in "listening" mode, causing a marked dissymmetry in the matrix, confirming the possibility of an ENC.

Different estimation methods of the transfer function matrix may be implemented and some of them are directed to a parameterization of the transfer function according to the temperature and the load on the network. Little improvement is obtained by introducing the variation of the resistance of the conductors with the temperature $$H_{i,j} = \frac{\sum_{m=1}^{M} (1 + \beta \cdot (T_m - T_r))^{-1} \cdot \partial v_{i,m} \cdot \partial c_{j,m}}{\sum_{m=1}^{M} \partial c_{j,m}^2} \text{ and} \quad (52)$$

$$\Delta v'_{i,m} = -(1 + \beta \cdot (T_m - T_r)) \cdot \sum_{j} \left( H_{i,j} - \frac{1}{I} \sum_{n=1}^{I} H_{n,j} \right) \cdot c_{j,m} \quad (53)$$

where β is the variation coefficient of the resistance with the temperature and $T_r$ is the reference temperature (usually 0° C.). However, a binning of the transfer function and, by extension, of the relative ohmic matrix as a function of the temperature significantly improves the modeling.

In the application PCT/CA2017/050448 (Léonard et al.), one of the proposed methods builds a group of samples corresponding to a ratio of loads exceeding a given threshold, this ratio being for example the load of a given meter over the load corresponding to the sum of the other meters. The calculation of the transfer function with equation 13a for the terms when the selected meter is "speaking" may advantageously be carried out from the samples of such a group where the "speaking" meter speaks loudly. This method allows cumulating less noisy information in the sums of equation 13a. For example, in the case of two meters dominating the load and carrying important currents, when one falls silent, the impact of the load variation of the other is listened and vice-versa. Of course, the meters measuring no significant current will generate a reduced population group, if any. The corresponding matrix term is then set to the lowest value of the other terms, thus close to the value $Z_0$.

Figure 12A:
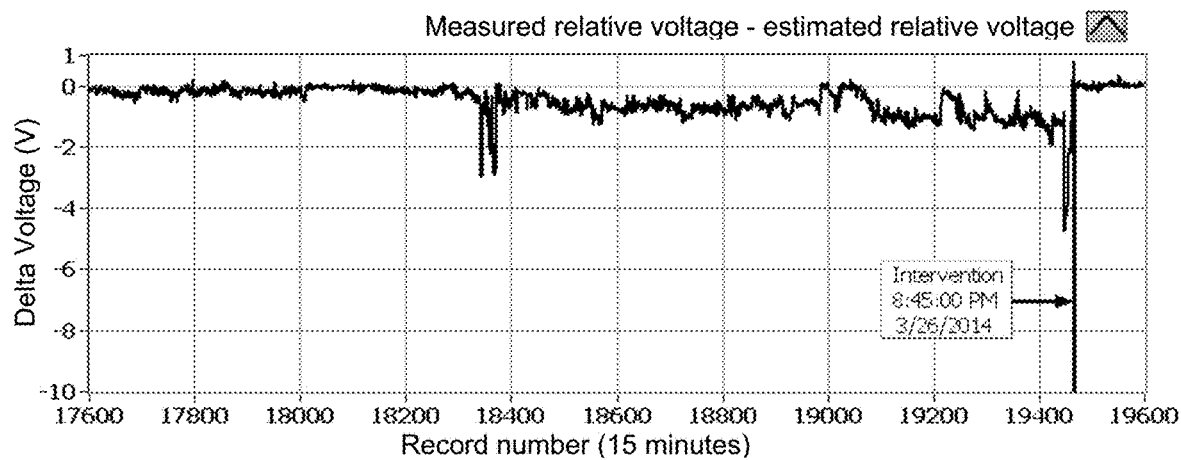
FIGS. 12A and 12B are graphs respectively illustrating the difference $\Delta\Delta v_{i,m}$ between the measured relative voltage and the predicted relative voltage for a meter having a hot spot, and the measured current and the unmetered current estimate for this meter.
Figure 12B:
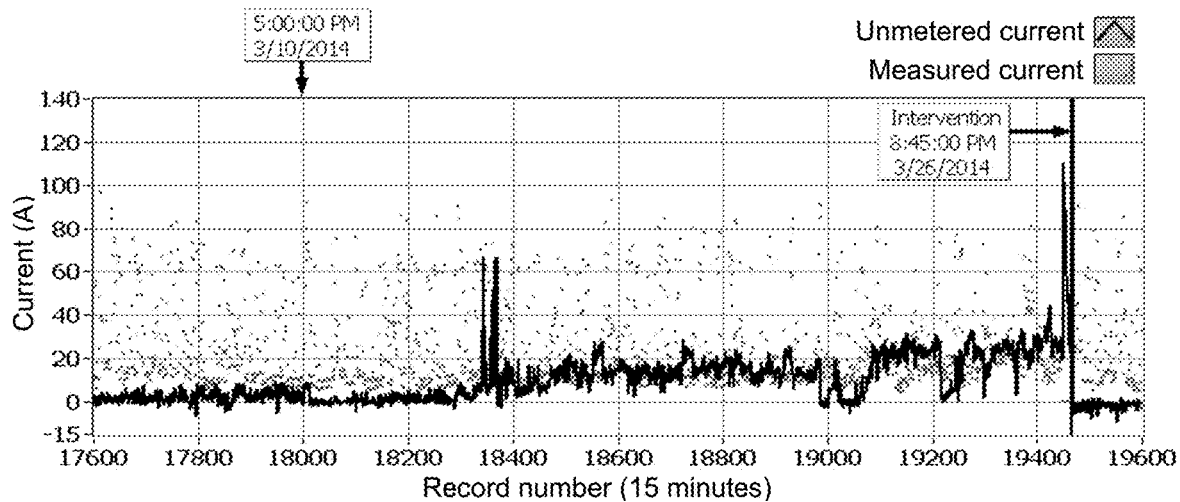

Referring to FIG. 12A, a case of hot spot on a meter observed from an anomaly of $\Delta\Delta v_{i,m}$, thus the difference between the measured relative voltage and the predicted relative voltage is illustrated. The presence of a hot spot increases the voltage drop sensed at the meter causing a progressive anomaly of a time length of more than 15 days until an intervention on the meter. The estimated voltage drops correspond to 15 minutes averaged measurements. The instantaneous voltage drops (fraction of second) sensed by the client may be much more important than the peak observed close to 5 V just before the corrective intervention. FIG. 12B displays the measured current (cloud of dots) and the estimate of the unmetered current (continuous curve) for this same example. According to the estimated model, the close to 5 V voltage drop corresponds to an unmetered current of 110 A according to a pattern that is incompatible to an electricity theft. The difference between the measured relative voltage and the predicted relative voltage provides more sensitivity than a simple graphical viewing of the transfer function and allows a qualification and a quantification of the hot spot or connection defect phenomenon. A simple calculation of the product of the voltage drop dispersion $\Delta\Delta v_{i,m}$ by the measured current determines the heat source in Watts corresponding to the anomaly found. Typically, a threshold of 250 W is set to determine if there is a fire hazard and the overrun of this threshold initiates a decision for interrupting the service that is transmitted to the meter. In the case of a hot spot of resistive type, the voltage drop appears proportional to the current, sometimes with a thermal heating based delay, so that this type of hot spot could be mixed up with a bypass.

Figure 13:
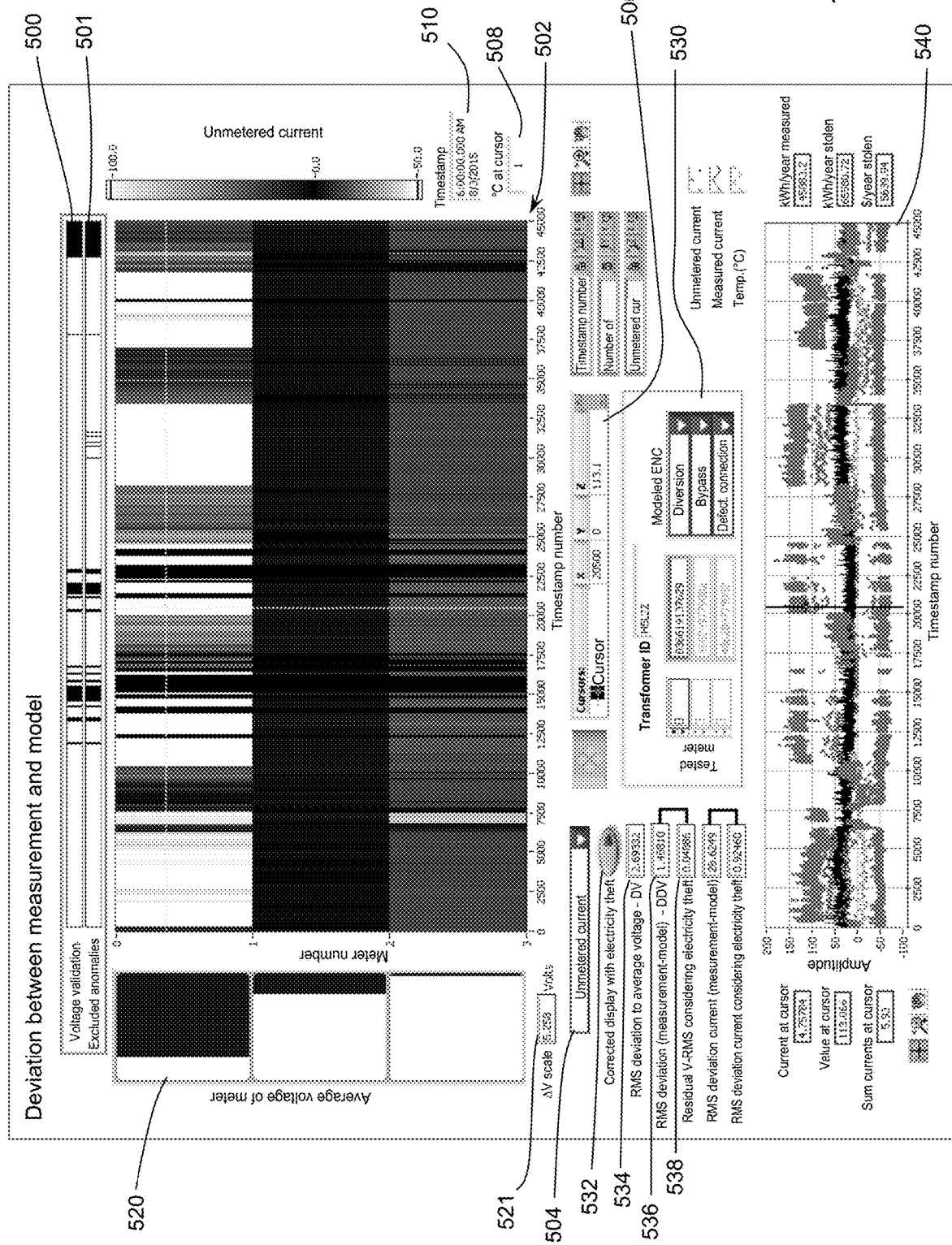
FIG. 13 is a schematic diagram illustrating an example of graphical user interface displaying a case of massive electricity theft by diversion for a marihuana production greenhouse.

Referring to FIG. 13, an example of graphical user interface (GUI) implemented in a system according to the invention, having interactive components for control and command of sequences and parameters of the method is illustrated. The GUI allows among other things to display various information generated and produced by the method, and to interact with ENC detection functions implemented according to the method, as well as setting or adjusting threshold values that may trigger procedures for re-calculating the ohmic and other matrices according to new parameters or detection warnings of potential ENCs detected. In the illustrated GUI example, a case of massive electricity theft for a marihuana production greenhouse is processed. In the GUI, starting from the top, two horizontal bars 500, 501 show a validity state of the measurement groups. Bar 500 is obtained with the detection of the voltage losses and power surges. Bar 501 shows a result where the minor anomalies detected after a first calculation of the ohmic matrix add up. Different measured or predicted quantities may be displayed on the main graphical display 502 as a function of time and meter identifiers. The time scale may be in hour, days, group number of measurements (as displayed in the graph) or another time unit. The meter identifiers may be order numbers of the meters, anonymous numbers or other identifiers. The choice of the displayed quantity may be made using a dropdown menu 504. The useful quantities that may be displayed include the measured voltage, the difference between the measured voltage and the average voltage, the measured current, the voltage drop delta $\Delta\Delta v_{j,m}$ and the unmetered current. A cursor with a configuration and display box 506 allows reading the graphical values by simultaneously displaying the corresponding temperature 508 and the timestamp 510. A thermometer graph 520 displays the average voltage of each meter allowing comparing the average voltage with the measured current and the unmetered current. For the graph 520, the range value of the thermometer is given below 521, thus 5.258 V in the example. In box 530 where the identifier of the transformer of the network under scrutiny is displayed, the user may manually configure the models of ENCs by selecting the meter number, the ENC type and other parameters (not visible for the "diversion" selection). Through a switch 532, the user may view the graph 502 for which the voltage drop deviations $\Delta\Delta v_{j,m}$ and the unmetered currents are modified while taking into account the contribution of the suspected ENCs. To assess the modeling quality, the standard deviation to the average voltage $STDV_A^2$ 534 is displayed and compared with the residual deviation after network modeling $STDV_{AA}^2$ 536 and the residual deviation after network and ENCs modeling $STDV_{AA|s}^2$ 538. A graphical display 540 located at the bottom of the GUI may show the trace of the meter corresponding to the cursor in the main graph 502, or the measurements relating to one of the meters that has a modeled ENC, the whole superimposed with the traces of temperature and current of the selected meter. The time position of the cursor of the lower graph 540 follows the position of the cursor of the upper graph 502. The values of current, sum of current and the value at the cursor for the cursor position are displayed on the left of the lower graph 540. The measured and stolen yearly energies in kWh and in monetary unit are displayed on the right.

A selection of the line and of the transformer, as well as the reading parameters, namely the start and the end of the groups of measurements to be processed, the validation parameters as the minimum voltage and the maximum voltage, may be performed on another GUI window (not shown). A viewing of the matrices, i.e. transfer function, dispersion, correlation and coherence as illustrated in FIGS. 6, 7, 8, 9A, 9B, 10, 11A and 11B, may also be generated in another GUI window (not shown). A compact form of GUI and of the different windows may be implemented for display on a cell phone or a tablet (not shown), and may provide an "expert" viewing mode displayed to the user after a detection of an ENC by the method according to the invention. The GUI may be simplified to provide a "normal" mode adapted to the needs of a non-expert user on the ground which allows determining the detected ENC type, where the ENC is located on the network, and if available a likelihood indication of the results.

Regarding the case of electricity theft shown in FIG. 13, the average voltage of the faulty meter is more than 4 V lower than that of the other meters. A calculation from this voltage drop and the resistance corresponding to the auto-term of the transfer function matrix (not shown for this case) namely 0.055Ω, gives an average of 4/0.055=72 A of total current, i.e. the measured current plus that of the electricity theft. Graph 540 of the GUI displays an electricity theft reaching 150 A but negative for over 50 A, giving a peak-to-peak value close to 200 A. The electricity theft introduces a bias in the calibration method of the voltage of meter #3 that shifts the estimate of the electricity theft current by a constant value. Different means may be implemented to renormalize the curve of the electricity theft current for a more precise estimate of the stolen kW. A method consisting in taking the lowest negative value as minimum value and subtracting this negative value from the estimate (i.e. subtracting a negative value amounts to adding the corresponding positive value) is not favored because it leads to an overestimation of the electricity theft currents by adding the peak value of the fluctuation, to which the measurement noise contributes, to the value of the estimated current for the electricity theft. A visual method consists in estimating a position of the middle of the lower trace and to take the corresponding value as value to be added for the renormalization. In FIG. 13, this value is approximately 50 A. The visual method may be automated by producing a histogram for the portion of the most negative values in order to find a first histogram peak from minus infinity. The first histogram peak then corresponds to the value of the correction to be applied for the renormalization. The search of the peak may be limited to a maximum percentile of the data, typically 10%. By adding the yearly measured and stolen kWh, the case illustrated in FIG. 13 gives an equivalent current of 78 A for a voltage of 245 V, which is close to the average current of 72 A previously estimated from the average voltage drop. In this example, the displayed standard deviation to the average voltage $STDV_A^2$ 534 is of 2.69 VRMS, the residual deviation after modeling of the network $STDV_{AA}^2$ 536 is of 1.48 VRMS and the residual deviation after modeling of the network and the ENCs $STDV_{AA|s}^2$ 538 is of 0.048 VRMS, which shows a good modeling. For meters having a specification of ±0.2%, thus ±0.5 V, the GUI displays in this example a RMS deviation of modeling ten times less than the specification despite a major ENC situation.

The anomaly detection and the diagnostic characterization of the detected anomalies may rely upon threshold overruns that may be in good part manually determined, hence the interest of a GUI with windows that may display the transfer function, dispersion, correlation and coherence matrices. The thresholds for a same detection function may be adjusted as a function of the number of meters and the size of the network (in town or in rural area), the size of the network being estimated from the resistive values of the transfer function matrix. Among the thresholds set for the terms of the transfer function matrix, thresholds for the maximum resistive value (1 Ohms) of the auto-terms and the minimum resistive value (8 mOhm) for the inter-terms (off-diagonal) may be appropriate. A threshold overrun for the average relative difference between the "speaking" and "listening" inter-terms of a meter indicates a dissymmetry possibly related to an ENC of hot spot or bypass type. The threshold overruns are considered valid only for the terms corresponding to meters that in "speaking mode" handle a significant minimum current according to another threshold based on the distribution of the derivatives of current. Among the thresholds set for the terms of the dispersion, correlation and coherence matrices, thresholds for the minimum value of the auto-terms and for the minimum value of the inter-terms (off-diagonal) may be set. Here again, the threshold overruns are considered valid only for the terms corresponding to meters that in "speaking" mode handle a significant minimum current to be heard by the other meters. Regarding the calculation of the voltage deviations between the measured relative voltage and the estimated one, a threshold may be set or adjusted as a function of the residual standard deviation $STDV_{\Delta A|s}^2$ defined at equation 47 so that the sensitivity increases with the precision of the modeling. Depending on the different overruns observed by the system, the system may identify the corresponding ENC type from a diagnostic table available in the database 301 (shown in FIG. 15). Thresholds based on the recognition of particular patters of ENCs on the values estimated and generated by the ohmic matrix model with the method according to the invention may also be added.

By adding the consumptions of all the meters connected to a transformer and by taking the estimated line voltage (reported to an average value according to the transformation ratio)

$$V_{Lm} = \frac{1}{I} \sum_{i=1}^{I} \left( v_{i,m} + \sum_{j=1}^{I} H_{i,j} \cdot c_{i,m} \right) \quad (54)$$

a voltage measurement and a measurement of current per transformer are obtained. An unmetered current $s_{i,m}$ may be added to $c_{i,m}$ in equation 50 if the current is known with enough certainty. The meters in the method according to the invention are then replaced by transformers each having a voltage measurement and a measurement of current. In this way, it is possible to model the medium-voltage network, to detect ENCs for the transformers to which a single meter is connected, to detect ENCs undetected for certain transformers and to detect other ENCs on the medium-voltage network as an unauthorized transformer performing a diversion on the medium-voltage network. The transformation ratio is not necessarily identical from one transformer to another due, among other things, to different models (size and marks) then creating a ratiometric bias between the voltages of the transformers. Yet, the calibration differences between meters are also of ratiometric nature. The correction method of the voltages proposed at equations 26 and 27 then also seeks the standardization of the transformation ratios present on the line under scrutiny. The method described in the application PCT/CA2017/050448 (Leonard et al.) may then be adapted in order to estimate the calibration coefficient values. The load loss in medium-voltage line being smaller compared to the load loss in low-voltage line, this embodiment of the method is especially intended for medium-voltage networks extending over a large territory.

Figure 14:
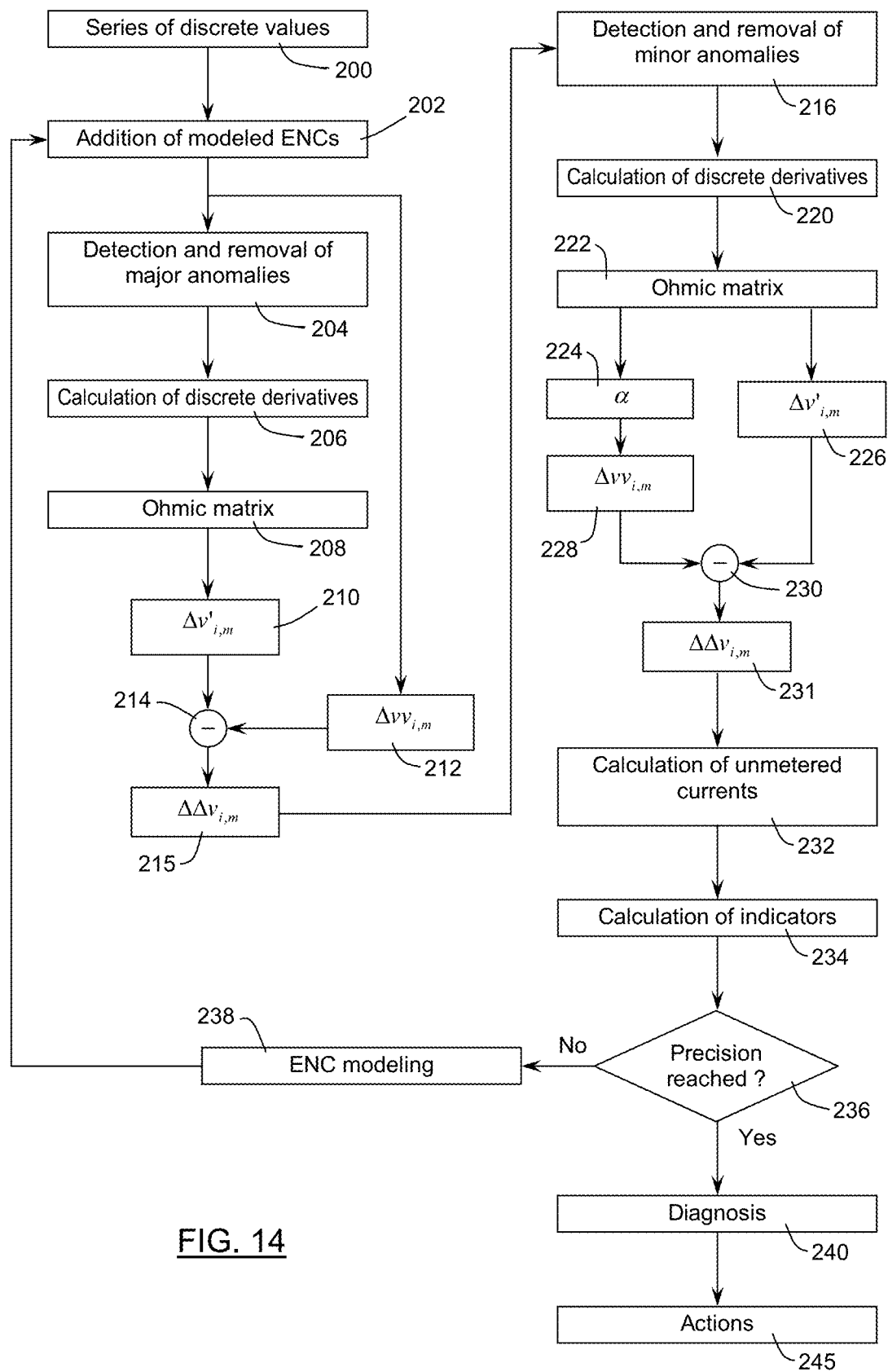
FIG. 14 is a schematic flowchart illustrating steps of the method according to an embodiment of the invention.

Referring to FIG. 14, a flowchart of steps for a possible embodiment of the method according to the invention is illustrated. The method may begin with step 200 consisting in a query of the database 301 (shown in FIG. 15) and calculations in order to determine discrete values of voltage and current relating to a low-voltage network regrouping a set of smart meters possibly connected to a same transformer. The database 301 describes transformer-meter pairings used in the query in order to collect groups of measurements common to the meters connected to a targeted transformer. A beginning and an end of the processed data, thus a number of groups of measurements, are determined at this step. The method may be successively applied to contiguous or partially overlapping blocks of groups of measurements, in which case a parameter defining a step between two processed blocks is added, thus a number of groups of measurements distancing each block to be processed. Over several contiguous blocks, it is normal to have meters whose transformer pairing changes. The blocks may then be excluded if a population of groups of measurements is below a given threshold, or truncated at the beginning or end where a pairing change occurs so that the groups of processed measurements are processed for a same low-voltage network configuration. In a first iteration, there is no addition of current corresponding to ENCs modeled at step 202. A calculation of the discrete derivatives of voltage and of current is carried out at step 206 after step 204 of detection and withdrawal of major anomalies deriving among other things from blackouts, power surges and time synchronization errors of the data. Step 208 proceeds with the calculation of the ohmic matrix generating the transfer function matrix and, if required as explained hereinabove, the dispersion matrix of the transfer function, the coherence matrix, the correlation matrix, the relative ohmic matrix, and is followed by step 210 carrying out an estimation of the voltage drops $\Delta v'_{i,m}$. Deviations of the relative voltage $\Delta vv_{i,m}$ are determined at step 212 and the voltage drops $\Delta v'_{i,m}$ are subtracted from these deviations at step 214 in order to obtain the deviation on the voltage drop $\Delta \Delta v_{i,m}$ between the measured and modeled at step 215. This deviation is afterwards compared, at step 216, to a threshold, for each meter taken individually or for a signal regrouping the deviations of the meters, in order to detect minor anomalies. Usually, the minor anomalies detected at step 216 are removed for the subsequent processing. However, in certain circumstances where these anomalies represent an important fraction of the population of the groups of measurements, the inverse may be done, i.e. the normal data are removed and the abnormal data are kept in case where the normal data would correspond to a state of electricity theft and the abnormal data to a state of no electricity theft. The calculation of the discrete derivatives of voltage and of current, the calculation of the ohmic matrix and the estimation of the voltage drops $\Delta v'_{i,m}$ are carried out again at steps 220, 222 and 226 on the new set of groups of measurements determined at step 216. Compared to step 208 carried out before removing the data corresponding to the minor anomalies, step 222 preferably comprises an additional sub-step of correcting certain terms of the transfer function matrix by, among other things, symmetrization and use of the simulated annealing method in order to further define the value of certain terms by minimizing the modeling error. Step 228 of calculating the relative voltage $\Delta vv_{i,m}$ is performed with the voltage calibrated from the calibration factors α determined by calculation at step 224. The voltage drops $\Delta vv_{i,m}$ calculated at step 228 are subtracted at step 230 from the deviations $\Delta v'_{i,m}$ estimated at step 226 in order to obtain the deviation on the voltage drop $\Delta\Delta v_{i,m}$ at step 231 followed by step 232 of calculating the unmetered currents and step 234 of calculating quality indicators of the analysis such as the values $STDV_A{}^2$, $STDV_{AA}{}^2$ and $STDV_{AA|s}{}^2$. Step 236 decides if the precision of the modeling is reached. In automatic mode, quality indicators may be compared to a threshold to determine if the targeted precision is reached and then stop the iterations to finish the execution of the method and transmit the results for example for database storage, for subsequent processing or display on a screen. In manual mode, the user may chose to submit modeling changes of the ENCs by step 238 causing a reiteration of the modeling steps, or to stop the iterations. The modeling of an ENC is based on the type of suspected ENC. For example, for a bypass, the measured current is multiplied by a suspected electricity theft factor. If it is observed that the bypass current represents 30% of the current measured by the meter, the measured current at step 202 is multiplied by 1.3 for the meter. For a diversion, the estimate of the unmetered current is added to the measured current at step 202. For a hot spot at a meter, the estimate of the observed voltage drop is added to the measured voltage at step 202 for this meter. For a meter suspected to be not connected to the network, the meter is removed from the batch of processed meters at step 202. For a meter suspected to be defective, its voltage measurement may be kept if it is assessed to be valid and the measured current is set to zero at step 202 for the meter. If the voltage measurement is not valid, the meter is removed from the batch of meters to be processed. In automatic mode, the number of iterations allowed for the modeling of the ENCs at step 238 may be limited e.g. to restrict the execution time of the method to a prescribed time. The loop exit may then happen without having reached the precision threshold checked at step 236. In automatic mode, the modeling of the ENCs at step 238 may be random by trial and error (e.g. simulated annealing method) by keeping the best results or a set of certain best results for one ENC at a time, by adding a new ENC after convergence of the iterations is observed. The addition of the modeled ENCs at step 202 may be located at the beginning of the process but also farther such as prior to the second calculation of the discrete derivatives of voltage and of current at step 220. Once the precision is reached or a number of iterations are completed, a diagnosis is carried out at step 240 from the threshold overruns and the diagnostic table stored in the database 301. If an ENC is detected, different actions may be commanded at step 245, as an on-site inspection and, in the case of a fire hazard by a hot spot, a transmission of a power service interruption command to the targeted meter.

Referring to FIG. 15, a system able to implement the method according to the invention is illustrated. According to a physical arrangement of connectivity intended to execute the method, a communication network 300 providing communication, control and command functions, receives consumption measurements from the smart meters 5 connected to the low-voltage network 2 connected at its turn to the medium-voltage line 15 by the transformer 3. The communication network 300 has communication equipments (not shown) that may have a memory temporarily storing the measurements to be transmitted in the form of data. A processing unit 302, comprising a processor 303, a memory 304, an input/output interface 305 and preferably a relational table 309 for anonymization of the data, is configured to receive the data (e.g. derived from the voltage measurements provided by the meters 5) from the communication network 300 or from a database 301 that may store histories of measurements provided by the meters 5, relational tables describing a topology of the network (e.g. meter-transformer pairings), preestablished threshold values and a diagnostic table applicable to the method. Table 2 below provides an example of diagnostic table.

TABLE 2

Diagnostic table

| | Meter connected to another network | By-pass | Diversion | Hot spots or connection defect | Defective meter |
|---|---|---|---|---|---|
| Transfer function Symmetry | X | X | | X | X |
| Transfer function Row < threshold | X | | | | X |
| Transfer function Row > threshold | | X | | | X |
| Transfer function Column < or > threshold | | | | X | X |
| Transfer function Dispersion > threshold | X | | | X | X |
| Correlation matrix Term < threshold | X | | | X | X |
| Coherence matrix Term < threshold | X | | | X | X |
| Voltage deviation > threshold | | | X | X | X |
| Unmetered current > threshold | | | X | X | X |

In the diagnostic table, the term "Diversion" includes an electricity theft by diversion, a presence of an electromechanical meter or a flat-rate connection. The term "Row" means one or more terms of the row (speaking meter) associated to a meter excluding the diagonal term. The term "Column" means one or more terms of the column (listening meter) associated to a meter excluding the diagonal term. Another diagnostic table may be used for meters exhibiting cycles of lighting units or consuming little. Instructions describing operations to be executed by the processor 303 for performing the method according to the invention, e.g. in the form of codes forming a program or an application, may be loaded in the memory 304 of the processing unit 302. The history of voltages stored in the database 301 may have been generated and stored in the memory 304 by the network 300 or by the processing unit 302. The processing unit 302 may be configured by a terminal 306 connected to the processing unit 302 or by configuration instructions via a communication network 307 connected to the input/output interface 305. The method may be manually started by a user for example using the terminal 306 or by a configuration comprising among other things a time interval between two automatic executions of the method. Other applications may through the communication network 307 read or modify the database 301, and more particularly the relational tables stored in the database 301. Other applications may configure the method in the processing unit 302 through the communication network 307 connected to the input/output interface 305 for example to set or adjust the thresholds or to use programmed functions useful to the method according to the invention. The processing unit 302 may begin the application/execution of the method as illustrated in FIG. 14 by a selection of the low-voltage network 1 (as shown in FIG. 4) to be tested and a query of the histories of the measurements of the meters 5 relating to the selected network 1. Further processing may be performed in the processing unit 302 or in a private cloud of shared applications 308 storing instructions for performing the method or a portion of the method. In the latter case, the data transmitted from the processing unit 302 in the private cloud 308 are preferably anonymized for example by creating a relational table 309 linking client identifiers to anonymous identifiers of the meters 5 as well as for identifiers of low-voltage networks 1 and identifiers of medium-voltage networks 15. The results of the method may be used by other methods or applications implemented in the processing unit 302 or in the private cloud 308, or transmitted for display to the terminal 306 or transmitted to any other system connected via the communication network 307. The display at the terminal 306 or on another device (not shown) may take the form of the GUI illustrated in FIG. 13 and of various windows of graphical representations as discussed above. The actions at step 245 (shown in FIG. 14) may be transmitted for display to the terminal 306 or transmitted to another system connected via the communication network 307, or yet transmitted to a targeted meter 5 via the communication network 300 in the case of a service interruption command.

Although the method according to the invention described above refers to several equations, it should be understood that the equations in question describe and define steps, sequences, systems, algorithms or forms of algorithms which, when implemented in and by a computer or a computer system, form a concrete embodiment of the invention. While embodiments of the invention have been illustrated in the accompanying drawings and described above, it will be evident to those skilled in the art that modifications may be made therein without departing from the invention. For example, a selection of the meters 5 in the method according to the invention may be a subset of the meters 5 allocated to a transformer 3 according to the pairings in the database 301, and others may be selected too. A meter 5 may be excluded from the selection when it is for example suspected to be defective, not connected to the involved transformer, or while consuming little energy has a connection defect disturbing its measured voltage to the point of adding more noise to the modeling than information. A meter 5 may be added to the selection if the meter comes from another transformer to which it does not seem to be connected, in order to test the meter-transformer pairing for the transformer 3 involved in the method. A better modeling then confirms the new meter-transformer pairing. In the case where a voltage measurement is available at the primary of the transformer 3 connected to the network 2, the transformer 3 may itself be considered as a smart meter 5. In the method according to the invention, a zero current value will be assigned to it, and the terms of the corresponding column in the transfer function matrix H will be set by symmetry in the terms of the corresponding row. For the auto-term, it will be set to a value equal to the average value of the inter-terms corresponding to the reference node, which are the smallest terms of the transfer function matrix. The transfer function matrix H is thereby corrected with regard to a zero current. A presentation and an examination of the different quantities and indicators determined by the method as a function of time, a position in a periodicity (time of day, day of the week), as a function of the temperature or as a function of the global load are other examples of functions than may be implemented in the method and the system according to the invention.

The invention claimed is:

1. A computer implemented method for detecting anomalies in an electrical network, the method comprising the steps of:
   (i) retrieving consumption measurements produced by meters presumed to be connected to a same transformer of the electrical network based on a preestablished topology of the electrical network, the consumption measurements being distributed through time;
   (ii) generating an ohmic matrix model of the electrical network, the ohmic matrix model having currents carried by the meters as input, relative voltage drops of the meters referenced to a voltage of a reference node located on the electrical network as output, and resistive quantities initially determined by currents and voltages between a voltage determined for one of the meters and an average of voltages determined for a set of meters of the electrical network as matrix terms;
   (iii) performing the following operations:
      comparing the resistive quantities of the ohmic matrix model with one another according to preestablished matrix comparison patterns and with respect to preestablished quantity thresholds indicative of anomalies;
      determining an instantaneous relative voltage drop of a meter based on the consumption measurements of the meter and determining deviations with respect to the instantaneous relative voltage drop estimated with the ohmic matrix model for the meter, the deviations exceeding a preset threshold being indicative of anomalies; and
      generating an inverse matrix model of the ohmic matrix model, the inverse matrix model having deviations of instantaneous relative voltage drops of the meters as input and unmetered currents as a function of the deviations as output, the unmetered currents exceeding a preset threshold being indicative of anomalies;
   (iv) depending on whether a preestablished modeling condition of the ohmic matrix model is satisfied or not, returning to step (ii) while modifying the input and the resistive quantities as a function of the anomalies detected at step (iii); and
   (v) providing a diagnosis of the electrical network characterizing the anomalies detected at step (iii).

2. The method according to claim 1, wherein the resistive quantities of the ohmic matrix model are determined as a function of a sum of products of voltage derivative of a first meter by derivatives of current of a second meter over a sum of squares of derivatives of current of the second meter, the first and second meters being a same meter to determine a diagonal matrix term of the ohmic matrix model.

3. The method according to claim 2, wherein the resistive quantities of the ohmic matrix model are corrected by an iterative optimization process guided by a reduction of a standard deviation between values predicted by the ohmic matrix model and corresponding values derived from the consumption measurements.

4. The method according to claim 1, wherein the voltage derived from the consumption measurements of a meter is corrected as a function of a preestablished calibration factor.

5. The method according to claim 1, further comprising the step of, between steps (ii) and (iv):
   determining a dispersion of the ohmic matrix model to determine fluctuation values of the resistive quantities of the ohmic matrix model;
   and wherein one of the matrix comparison patterns comprises a distribution of the fluctuation values in the ohmic matrix model and one of the preestablished quantity thresholds comprises a fluctuation value.

6. The method according to claim 1, further comprising the step of, between steps (ii) and (iv):
generating a correlation matrix between the voltages and the currents of the meters;
and wherein one of the matrix comparison patterns comprises a distribution of correlation values in the correlation matrix and one of the preestablished quantity thresholds comprises a correlation value.

7. The method according to claim 1, further comprising the step of, between steps (ii) and (iv):
generating a coherence matrix between the voltages and the currents of the meters;
and wherein one of the matrix comparison patterns comprises a distribution of coherence values in the coherence matrix and one of the preestablished quantity thresholds comprises a coherence value.

8. The method according to claim 1, wherein the consumption measurements where the deviations determined exceed a preestablished quantity threshold are removed prior to step (iv).

9. The method according to claim 1, wherein the preestablished modeling condition comprises a reduction of a standard deviation between values predicted by the ohmic matrix model and corresponding values derived from the consumption measurements.

10. The method according to claim 1, wherein the reference node is a connection of one of the meters or a line junction of the electrical network or a power generating source of the electrical network.

11. The method according to claim 1, wherein the preestablished matrix comparison patterns comprise a symmetry of the matrix inter-terms with respect to a diagonal formed by auto-terms of the ohmic matrix model.

12. The method according to claim 1, wherein the diagnosis is displayed in a graphical user interface having interactive components of command and of control of sequences and parameters of the method.

13. A system for detecting anomalies in an electrical network, the system comprising a processing unit having a processor and a memory in communication with the processor, the memory storing instructions that, when executed by the processor, cause the processor to perform the steps of:
(i) retrieving consumption measurements produced by meters presumed to be connected to a same transformer of the electrical network based on a preestablished topology of the electrical network, the consumption measurements being distributed through time;
(ii) generating an ohmic matrix model of the electrical network, the ohmic matrix model having currents carried by the meters as input, relative voltage drops of the meters referenced to a voltage of a reference node located on the electrical network as output, and resistive quantities initially determined by currents and voltages between a voltage determined for one of the meters and an average of voltages determined for a set of meters of the electrical network as matrix terms;
(iii) performing the following operations:
comparing the resistive quantities of the ohmic matrix model with one another according to preestablished matrix comparison patterns and with respect to preestablished quantity thresholds indicative of anomalies;
determining an instantaneous relative voltage drop of a meter based on the consumption measurements of the meter and determining deviations with respect to the instantaneous relative voltage drop estimated with the ohmic matrix model for the meter, the deviations exceeding a preset threshold being indicative of anomalies; and
generating an inverse matrix model of the ohmic matrix model, the inverse matrix model having deviations of instantaneous relative voltage drops of the meters as input and unmetered currents as a function of the deviations as output, the unmetered currents exceeding a preset threshold being indicative of anomalies;
(iv) depending on whether a preestablished modeling condition of the ohmic matrix model is satisfied or not, returning to step (ii) while modifying the input and the resistive quantities as a function of the anomalies detected at step (iii); and
(v) providing a diagnosis of the electrical network characterizing the anomalies detected at step (iii).

14. The system according to claim 13, further comprising a screen connected to the processor, the instructions comprising instructions causing the processor to display on the screen a graphical user interface having interactive components of command and control of sequences and parameters of the steps that the system performs.

15. A non-transitory tangible computer program product for detecting anomalies in an electrical network, storing instructions that, when executed by a processor, cause the processor to perform the steps of:
(i) retrieving consumption measurements produced by meters presumed to be connected to a same transformer of the electrical network based on a preestablished topology of the electrical network, the consumption measurements being distributed through time;
(ii) generating an ohmic matrix model of the electrical network, the ohmic matrix model having currents carried by the meters as input, relative voltage drops of the meters referenced to a voltage of a reference node located on the electrical network as output, and resistive quantities initially determined by currents and voltages between a voltage determined for one of the meters and an average of voltages determined for a set of meters of the electrical network as matrix terms;
(iii) performing the following operations:
comparing the resistive quantities of the ohmic matrix model with one another according to preestablished matrix comparison patterns and with respect to preestablished quantity thresholds indicative of anomalies;
determining an instantaneous relative voltage drop of a meter based on the consumption measurements of the meter and determining deviations with respect to the instantaneous relative voltage drop estimated with the ohmic matrix model for the meter, the deviations exceeding a preset threshold being indicative of anomalies; and
generating an inverse matrix model of the ohmic matrix model, the inverse matrix model having deviations of instantaneous relative voltage drops of the meters as input and unmetered currents as a function of the deviations as output, the unmetered currents exceeding a preset threshold being indicative of anomalies;
(iv) depending on whether a preestablished modeling condition of the ohmic matrix model is satisfied or not, returning to step (ii) while modifying the input and the resistive quantities as a function of the anomalies detected at step (iii); and (v) providing a diagnosis of the electrical network characterizing the anomalies detected at step (iii).

\* \* \* \* \*